United States Patent
Hiroi et al.

(10) Patent No.: US 10,263,066 B2
(45) Date of Patent: Apr. 16, 2019

(54) MEMORY AND LOGIC DEVICE AND METHOD FOR MANUFACTURING THE SAME

(71) Applicant: Renesas Electronics Corporation, Kawasaki-shi (JP)

(72) Inventors: Masayuki Hiroi, Kanagawa (JP); Takashi Sakoh, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 13/852,917

(22) Filed: Mar. 28, 2013

(65) Prior Publication Data

US 2013/0285203 A1 Oct. 31, 2013

(30) Foreign Application Priority Data

Apr. 25, 2012 (JP) ................... 2012-099630

(51) Int. Cl.
*H01L 49/02* (2006.01)
*H01L 27/108* (2006.01)
(Continued)

(52) U.S. Cl.
CPC .......... *H01L 28/40* (2013.01); *H01L 23/5329* (2013.01); *H01L 27/0207* (2013.01);
(Continued)

(58) Field of Classification Search
CPC ................. H01L 28/91; H01L 27/0207; H01L 27/10894; H01L 23/585; H01L 28/40;
(Continued)

(56) References Cited

U.S. PATENT DOCUMENTS 6,303,047 B1 * 10/2001 Aronowitz et al. ............. 252/1
6,954,371 B2    10/2005 Hokari et al.
(Continued)

FOREIGN PATENT DOCUMENTS

JP    2002-134506 A    5/2002
JP    2005-051044 A    2/2005
(Continued)

OTHER PUBLICATIONS

Simpson and Weiner, "The Oxford English Dictionary", 1989, Clarendon Press, V 20.*

(Continued)

*Primary Examiner* — Ismail A Muse
*Assistant Examiner* — Patricia D Reddington
(74) *Attorney, Agent, or Firm* — McGinn I.P. Law Group, PLLC

(57) ABSTRACT

The present invention is directed to a semiconductor integrated circuit device that basically has a non-memory array area, a memory array area, and memory capacitors formed across lower embedded metal interconnection layers including a low-dielectric constant interlayer insulating film in the memory array area. In addition, a memory-periphery metal seal ring is provided in the lower embedded metal interconnection layers having at least the low-dielectric constant interlayer insulating film so as to surround the memory array area.

19 Claims, 27 Drawing Sheets

(51) Int. Cl.
*H01L 27/02* (2006.01)
*H01L 23/532* (2006.01)
*H01L 23/00* (2006.01)

(52) U.S. Cl.
CPC .. *H01L 27/10852* (2013.01); *H01L 27/10894* (2013.01); *H01L 27/10897* (2013.01); *H01L 28/91* (2013.01); *H01L 23/562* (2013.01); *H01L 2924/00* (2013.01); *H01L 2924/0002* (2013.01); *H01L 2924/00014* (2013.01)

(58) Field of Classification Search
CPC ........... H01L 23/5329; H01L 27/10852; H01L 27/10897; H01L 23/562; H01L 2924/0002
USPC ....................................................... 257/532
See application file for complete search history.

(56) References Cited

U.S. PATENT DOCUMENTS

| | | | |
|---|---|---|---|
| 6,998,712 B2* | 2/2006 | Okada | H01L 22/32 257/758 |
| 7,339,256 B2 | 3/2008 | Nakamura et al. | |
| 7,550,850 B2 | 6/2009 | Nakashiba | |
| 8,258,039 B2 | 9/2012 | Inoue | |
| 8,390,046 B2 | 3/2013 | Kawahara et al. | |
| 2005/0023589 A1* | 2/2005 | Yamada | H01L 27/10855 257/310 |
| 2009/0078981 A1* | 3/2009 | Yokoi | H01L 27/10894 257/306 |
| 2009/0108452 A1* | 4/2009 | Nemoto | C23C 14/0641 257/751 |
| 2011/0001216 A1* | 1/2011 | Inoue | H01L 27/105 257/532 |
| 2011/0117718 A1* | 5/2011 | Nakamura et al. | 438/387 |
| 2011/0121375 A1 | 5/2011 | Kawahara et al. | |
| 2011/0165756 A1* | 7/2011 | Isogai | H01L 23/585 438/397 |
| 2012/0119326 A1* | 5/2012 | Sugisaki | H01G 4/005 257/532 |
| 2012/0261798 A1 | 10/2012 | Inoue | |

FOREIGN PATENT DOCUMENTS

| | | |
|---|---|---|
| JP | 2005-229086 A | 8/2005 |
| JP | 2006-147668 A | 6/2006 |
| JP | 2011-14731 A | 1/2011 |
| JP | 2011-114049 A | 6/2011 |
| JP | 2011-142214 A | 7/2011 |

OTHER PUBLICATIONS

Japanese Office Action dated Nov. 19, 2015 with an English translation thereof.

* cited by examiner

MEMORY AND LOGIC DEVICE AND METHOD FOR MANUFACTURING THE SAME

CROSS-REFERENCE TO RELATED APPLICATIONS

The disclosure of Japanese Patent Application No. 2012-099630 filed on Apr. 25, 2012 including the specification, drawings and abstract is incorporated herein by reference in its entirety.

BACKGROUND

The present invention relates to semiconductor integrated circuit devices (or semiconductor devices), and more particularly to a technique effectively adaptable to a semiconductor integrated circuit device including a memory array unit.

Japanese Unexamined Patent Application Publication No. 2011-14731 (Patent Literature 1) concerns an embedded DRAM (Dynamic Random Access Memory), or eDRAM, in which a memory array unit is integrated in a logic chip. This publication discloses that, in a COB (Capacitor Over Bit-line) memory array unit, an interlayer insulating film between layers in which a memory capacitor is provided is a low dielectric constant (Low-k) silicon oxide-based insulating film such as SiOC.

Japanese Unexamined Patent Application Publication No. 2011-114049 (Patent Literature 2) or US Patent Published Application No. 2011-121375 (Patent Literature 3) corresponding thereto discloses a COB embedded DRAM with a memory capacitor provided in the same layers with interconnection layers of a logic circuit unit (this capacitor is occasionally referred to as "interconnection-layer intrusion-type memory capacitor" in this application).

Japanese Unexamined Patent Application Publication No. 2011-142214 (Patent Literature 4) or US Patent No. 2011-165756 (Patent Literature 5) corresponding thereto discloses a guard ring that is formed in a COB embedded DRAM so as to surround a memory array and is made of mainly metal materials such as tungsten.

SUMMARY

In recent years, low dielectric constant silicon oxide-based insulating films are used in LSI (Large Scale Integration) for the purpose of interconnection capacitance reduction. DRAM/logic (non-memory area) embedded LSI (a logic chip with an embedded DRAM) also employs the low dielectric constant silicon oxide-based insulating films especially for narrow-spaced interconnection portions of relatively lower layers. In addition, with the LSI becoming finer, there has been proposed a structure with a memory capacitor provided in the interconnection portions of relatively lower layers (interconnection-layer intrusion-type memory capacitor) to ensure the capacitance of the memory capacitor. However, studies by inventors of the present invention revealed that such a structure has difficulties eliminating the influence of moisture, chemical solution components, radicals, and other factors migrated to a non-memory area (more specifically, a non-memory array area) through the low dielectric constant silicon oxide-based insulating film during memory capacitor processing.

Means and measures to address the problem will be described below; however, further problems and novel features will more fully appear from the description of this specification and the accompanying drawings.

Among the aspects of this invention, following is a brief outline of a representative aspect.

According to an aspect of this invention in outline, a semiconductor integrated circuit device basically has a non-memory array area and a memory array area, and has memory capacitors formed across lower embedded metal interconnection layers including a low-dielectric constant interlayer insulating film in the memory array area. In addition, a memory-periphery metal seal ring is provided in the lower embedded metal interconnection layers having at least the low-dielectric constant interlayer insulating film so as to surround the memory array area.

Among the aspects of this invention, following is a brief description about the effectiveness obtained from a representative aspect.

According to the aspect of the present application, the non-memory array area can avoid damage (including secondary damage derived from initial damage) during memory capacitor processing.

DETAILED DESCRIPTION

[Outline of Embodiment]

Figure 1:
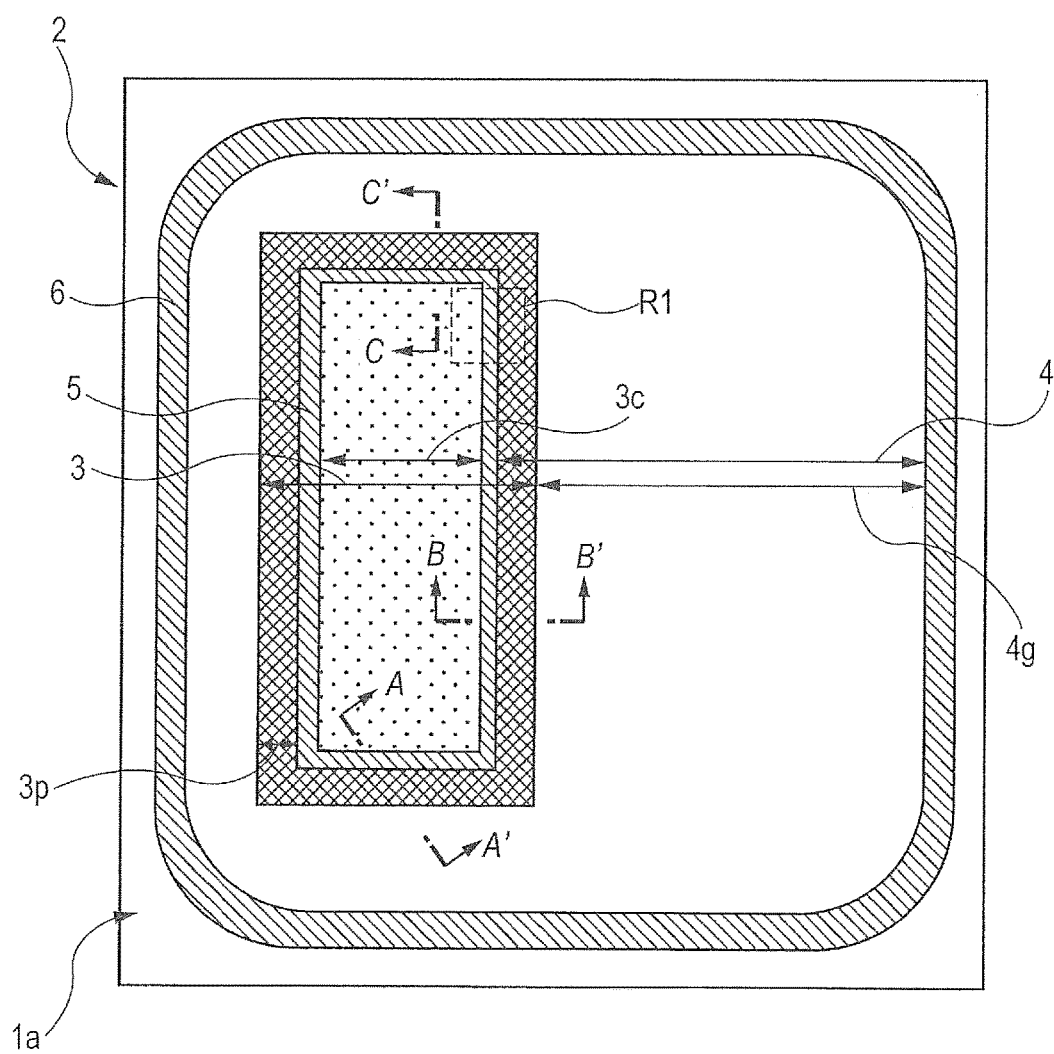
FIG. 1 is a top view briefly showing the entire top surface layout of a semiconductor chip to describe the device structure (memory-periphery metal seal ring Vbb coupling structure), layout and other features of an embedded DRAM (i.e., DRAM-embedded logic chip) that is an exemplary semiconductor integrated circuit device according to an embodiment of the present application.

First of all, outlines of a typical embodiment according to the present invention disclosed in this application will be given.

1. A semiconductor integrated circuit device includes:

(a) a semiconductor substrate having a first main surface and a second main surface;

(b) a memory array area and a non-memory array area provided over the first main surface;

(c) a first embedded metal interconnection layer to an Nth embedded metal interconnection layer provided over the first main surface;

(d) a low-dielectric constant interlayer insulating film provided to at least one of the first to Nth embedded metal interconnection layers;

(e) a plurality of memory capacitors provided across at least from the first to Nth embedded metal interconnection layers; and (f) a memory-periphery metal seal ring provided between the memory array area and the non-memory array area so as to surround the memory array area and extending across the embedded metal interconnection layers including the low-dielectric constant interlayer insulating film.

2. In the semiconductor integrated circuit device according to item 1, the low-dielectric constant interlayer insulating film is a porous low-dielectric constant film.

3. In the semiconductor integrated circuit device according to item 2, the memory array area has a COB structure.

4. In the semiconductor integrated circuit device according to item 3, the memory capacitors have an upper electrode interconnecting the memory capacitors and lower electrodes provided to respective memory capacitors.

5. In the semiconductor integrated circuit device according to item 4, the memory-periphery metal seal ring and the upper electrode are held at substantially the same potential.

6. In the semiconductor integrated circuit device according to item 5, the memory-periphery metal seal ring is held at a precharge potential, which is a substantially midpoint potential between a supply potential and a ground potential.

7. In the semiconductor integrated circuit device according to item 4, the memory-periphery metal seal ring and a P-type well region in the memory array area are held at substantially the same potential.

8. In the semiconductor integrated circuit device according to item 7, the memory-periphery metal seal ring is held at a substantially back bias potential of the memory array area.

9. In the semiconductor integrated circuit device according to item 4, the memory-periphery metal seal ring is electrically separated from the P-type well region in the memory array area at the semiconductor substrate.

10. In the semiconductor integrated circuit device according to item 9, the memory-periphery metal seal ring is held at a substantially ground potential.

11. In the semiconductor integrated circuit device according to item 10, the non-memory array area includes a logic circuit area.

12. A method for manufacturing a semiconductor integrated circuit device includes:

(a) preparing a semiconductor substrate having a first main surface and a second main surface, the semiconductor substrate further having:

a memory array area and a non-memory array area provided over the first main surface;

a first embedded metal interconnection layer to an Nth embedded metal interconnection layer provided over the first main surface;

a low-dielectric constant interlayer insulating film provided to at least one of the first to Nth embedded metal interconnection layers; and a memory-periphery metal seal ring provided between the memory array area and the non-memory array area so as to surround the memory array area and extending across the embedded metal interconnection layers including the low-dielectric constant interlayer insulating film; and (b) forming a plurality of memory capacitors across at least from the first to Nth embedded metal interconnection layers in the memory array area subsequent to the step (a).

[Explanations of Description Form, Basic Terms, and Usage in the Present Application]

1. In the present application, the descriptions of embodiments may be divided into a plurality of sections for convenience, if necessary. However, unless otherwise particularly specified, these sections are neither independent nor separate from each other, but are respective parts of a single example, in a relation such that one is a detailed explanation of a part of the other, a modification example of a part or the whole, or the like of the other. Further, repetitions of similar parts will be omitted in principle. Whereas, respective constitutional elements in embodiments are not essential, unless otherwise specified, or except for the case where the number is theoretically limited, and unless otherwise apparent from context.

Moreover, in the present application, when the term "a semiconductor device" or "a semiconductor integrated circuit device" is cited, the term mostly means a device formed by integrating various transistor single bodies (active elements) and resistances, capacitors, and other components around the transistors over a semiconductor chip (for example, a monocrystalline silicon substrate) or the like, or a device formed by packaging the semiconductor chip and so on. A representative example of such various transistors can be a MISFET (Metal Insulator Semiconductor Field Effect Transistor) represented by a MOSFET (Metal Oxide Semiconductor Field Effect Transistor). In this case, a representative example of an integrated circuit structure can be a CMIS (Complementary Metal Insulator Semiconductor) type integrated circuit represented by a CMOS (Complementary Metal Oxide Semiconductor) type integrated circuit formed by combining an N-channel MISFET with a P-channel MISFET.

Today's wafer process of a semiconductor integrated circuit device, namely an LSI (Large Scale Integration), is generally divided broadly into two parts. The first part includes an FEOL (Front End of Line) process ranging from carry-in of a silicon wafer as a primary material to the vicinity of a pre-metal process (a process including steps of forming an interlayer insulating film between the bottom end of a first interconnection layer and a gate electrode structure, and the like, forming a contact hole, tungsten plugging, filling, and other steps). The second part includes a BEOL (Back End of Line) process beginning from the step of forming the first interconnection layer and finishing around the step of forming a pad opening in a final passivation film over an aluminum-based pad electrode (in a wafer level package process, the step is included). In the FEOL process, a gate electrode patterning step, a contact hole forming step, and the like are microfabrication steps requiring particularly fine processing.

2. Similarly, in the description of embodiments and some other parts, the term "X including A" and similar expressions for materials, compositions, or the like do not exclude the one including an element other than A as a main constitutional element unless otherwise specified and unless otherwise apparent from the context. Regarding components, for example, the term is used to embrace "X including A as a main component", and the like. For example, it is naturally understood that the term "silicon member" or the like herein used is not limited to pure silicon, but also embraces a SiGe alloy, other multi-component alloys containing silicon as a main component, and other members containing additives, and the like.

Likewise, the descriptions of "a silicon oxide film", "a silicon oxide-based insulating film", and the like include not only a relatively pure undoped silicon dioxide, but may be an insulating film mainly including other kinds of silicon oxide. For example, the silicon oxide film may be a silicon oxide-based insulating film doped with impurity, such as TEOS-based silicon oxide, PSG (Phosphorus Silicate Glass), and BPSG (Borophosphosilicate Glass). In addition, a thermally-oxidized film, a CVD oxide film, coating type silicon oxide film, such as SOG (Spin On Glass) and nano-clustering silica (NCS), can be also the silicon oxide film and silicon oxide-based insulating film. In addition, FSG (Fluorosilicate Glass), SiOC (Silicon Oxicarbide), or carbon-doped silicon oxide, or a Low-k insulation film, such as OSG (Organosilicate Glass), can be also the silicon oxide film and silicon oxide-based insulating film. Furthermore, a silica-based Low-k insulating film formed by introducing pores to a member similar to the above members (a porous type insulating film, the term "porous" includes molecular-pore-stack) can be also the silicon oxide film and silicon oxide-based insulating film.

Along with a silicon oxide-based insulating film, a silicon-based insulating film generally used in the semiconductor field includes a silicon nitride-based insulating film. As materials belonging to the kind, there are SiN, SiCN, SiNH, SiCNH, and others. When the term "silicon nitride" is cited, the term includes both SiN and SiNH unless otherwise particularly specified. Likewise, when the term "SiCN" is cited, the term includes both SiCN and SiCNH unless otherwise particularly specified.

SiC has a nature similar to SiN, but SiON should be classified rather as a silicon oxide-based insulating film in many cases.

The silicon nitride film is frequently used as an etch stop film, that is CESL (Contact Etch-Stop Layer), in the SAC (Self-Aligned Contact) technique, and, in addition, is also used as a stress imparting film in SMT (Stress Memorization Technique).

Similarly, the expression "nickel silicide" means, usually, nickel monosilicide, but it includes not only relatively pure nickel monosilicide, but also alloys, mixed crystals and the like which include nickel monosilicide as a main constituent. Further, the silicide is not limited to nickel silicide, but it may be cobalt silicide, titanium silicide, tungsten silicide and the like that have provided good results in the past. As a metal film for silicidation, in addition to a Ni (nickel) film, there may be used, for example, nickel alloy films such as a Ni—Pt alloy film (an alloy film of Ni and Pt), a Ni—V alloy film (an alloy film of Ni and V), a Ni—Pd alloy film (an alloy film of Ni and Pd), a Ni—Yb alloy film (an alloy film of Ni and Yb) and a Ni—Er alloy film (an alloy film of Ni and Er). Note that these silicides containing nickel as a main metal element are collectively referred to as "nickel-based metal silicides".

3. Likewise, preferable examples are shown for shapes, positions, attributes, and the like. However, it is naturally understood that the present invention is not strictly limited thereto unless otherwise specified, and unless otherwise apparent from the context.

4. Further, also when a reference is made to a specific numerical value or quantity, the numerical value may be a numerical value greater than the specific value or a numerical value less than the specific value, unless otherwise specified, except for the case where the number is theoretically limited to the numerical value, and unless otherwise apparent from the context.

5. When the term "a wafer" is cited herein, generally the term denotes a monocrystalline silicon wafer over which a semiconductor integrated circuit device (a semiconductor device and an electronic device are included) is formed, but it is needless to say that the term "a wafer" includes a composite wafer or the like with an insulation substrate, such as an epitaxial wafer, an SOI substrate, and an LCD glass substrate, and a semiconductor layer or the like.

6. In this application, the term "memory array area" denotes an area with memory cells arranged in a matrix, while the term "non-memory array area" denotes a "memory peripheral area" and "non-memory area". Specifically, the memory peripheral area refers to areas in the vicinity of and around the memory array area, and more specifically, refers to areas in which a sense amplifier, a wordline driver and the like are provided. The non-memory area refers to areas outside the memory area of interest, including, for example, areas with a logic area, other memory areas and the like provided.

In addition, the terms "low-dielectric constant interlayer insulating film", "Low-k interlayer insulating film" and other similar expressions denote, for example, insulating films, represented by SiOC, SiOCH and so on, with a dielectric constant lower than general TEOS-based silicon oxide CVD films. Especially, when the terms "porous low-dielectric constant interlayer insulating film" and "porous Low-k interlayer insulating film" are used, they include both molecular-pore-stacked films and structurally porous films (or physically porous films) derived from Porogen or the like.

Furthermore, when the upper end of the metal interconnection region where a memory capacitance is formed is defined by using interconnection layers, the term "N" of "Nth embedded metal interconnection layer" is a positive integer of 2 or higher (e.g., 2, 3, 4), which is equivalent to or lower than the hierarchy level of the uppermost embedded metal interconnection layer.

[Detailed Description of Embodiment]

The following further describes the details of embodiments. Throughout the accompanying drawings, identical or like parts are designated by identical or like reference symbols or numerals to avoid repetitive description thereof in principle.

In addition, in the accompanying drawings, hatching or the like for representing a cross section is sometimes omitted when it rather increases in complexity or when vacant spaces are apparently distinguishable. In this regard, when it is obvious from explanations or the like, the profile line of the background may sometimes be omitted even for a closed hole in a planar manner. Furthermore, in order to show an element rather than vacant space explicitly, hatching may be applied even if it is not a cross section.

Prior patent applications disclosing an embedded DRAM (a chip with DRAM and logic embedded) in which memory capacitors are partially formed in interconnection regions include, for example, Japanese Patent Application No. 2011-191983 (filing date in Japan: Sep. 2, 2011).

1. Description on the Device Structure (Memory-Periphery Metal Seal Ring Vbb Coupling Structure), Layout and Other Features of an Embedded DRAM(i.e., DRAM-embedded Logic Chip) that is an Exemplary Semiconductor Integrated Circuit Device According to an Embodiment of the Present Invention (Mainly from FIGS. 1 to 9)

The following example is to specifically describe mainly a DRAM layout having a folded bitline structure; however, it is needless to say that the present invention can be applied to a DRAM layout having an open bitline structure. In addition, the following example is to specifically describe a so-called closed packed folded bitline layout; however, it is needless to say that the present invention can be applied to a so-called half pitch folded bitline layout.

The following mainly describes an embedded DRAM as an example in detail; however, it is needless to say that the present invention can be applied to a stand-alone DRAM.

In this application, the impurity structure of well regions, source/drain regions and some other regions in a semiconductor substrate is not illustrated, in principle, except as required to specifically describe, to avoid complexity.

In addition, since the following cross-sectional views include repetitive structure (including subject structure), the repetitive structure may be partially omitted in an appropriate manner when only a different structure part cannot be cut out therefrom well.

Furthermore, the following embodiment will be described in detail with a 40 nm technology node device as an example; however, it is needless to say that the present invention can be applied to 28 nm technology node devices and beyond, and also devices not as fine as those.

Figure 2:
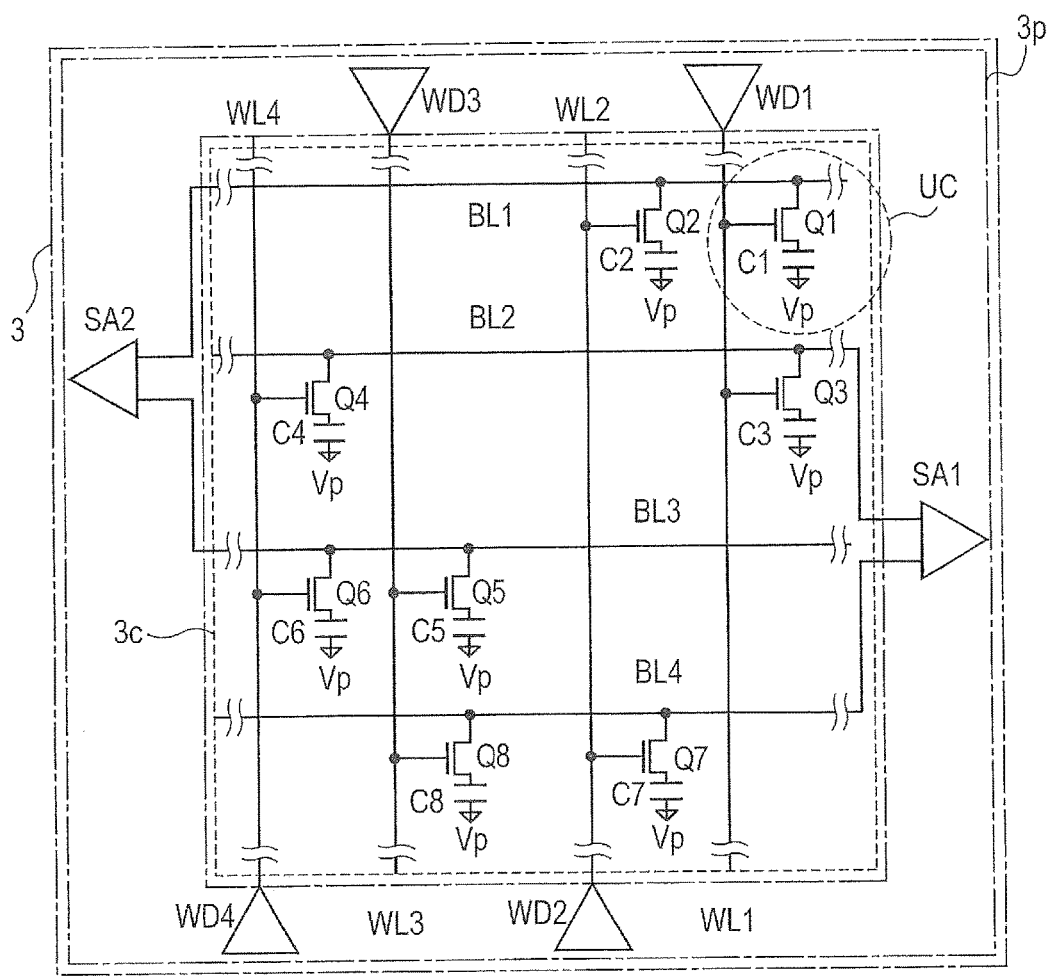
FIG. 2 is a schematic circuit diagram of a memory area 3 in FIG. 1.
Figure 3:
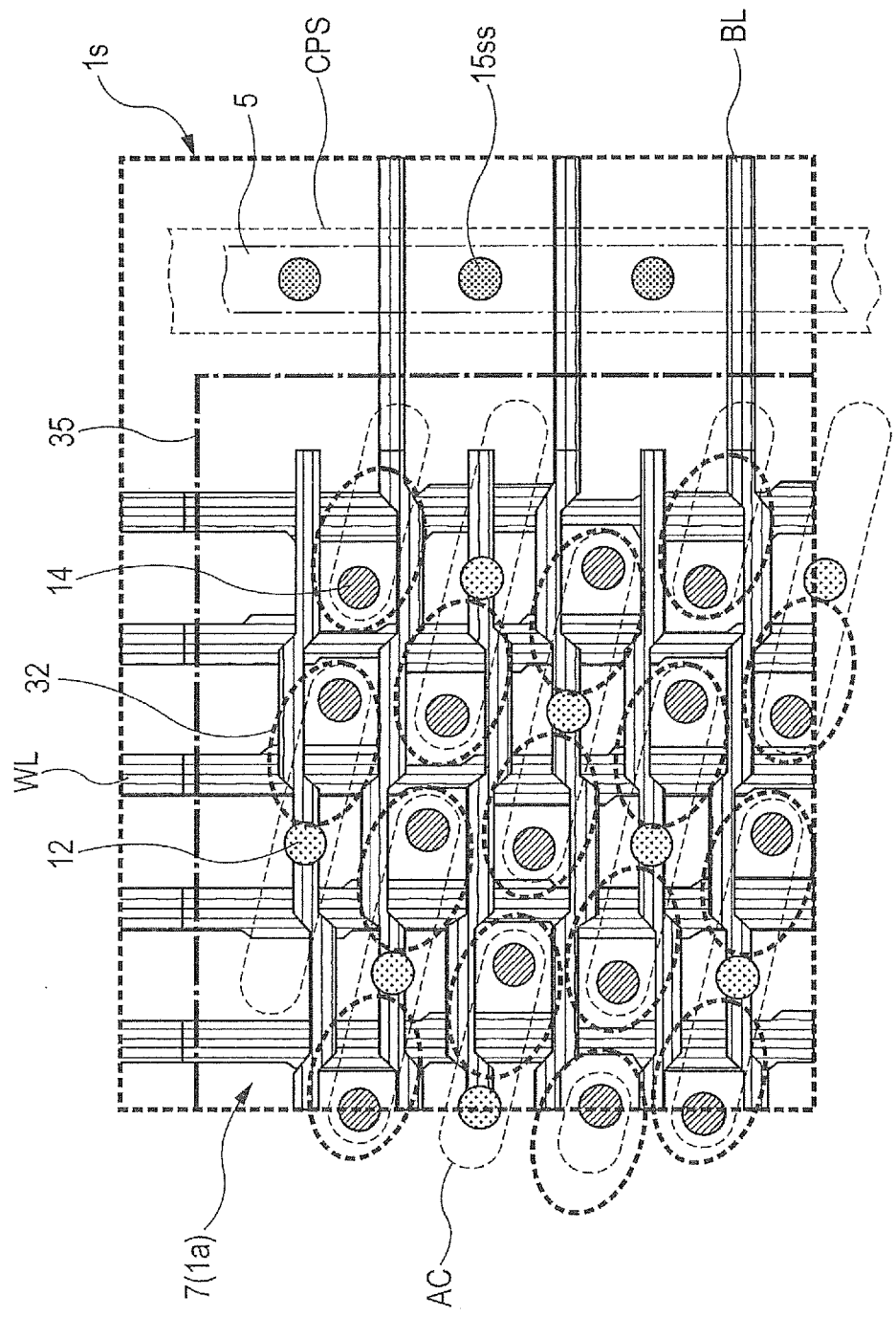
FIG. 3 is a plan layout of a region R1 cut out from the vicinity of a corner of the memory area in FIG. 1.
Figure 4:
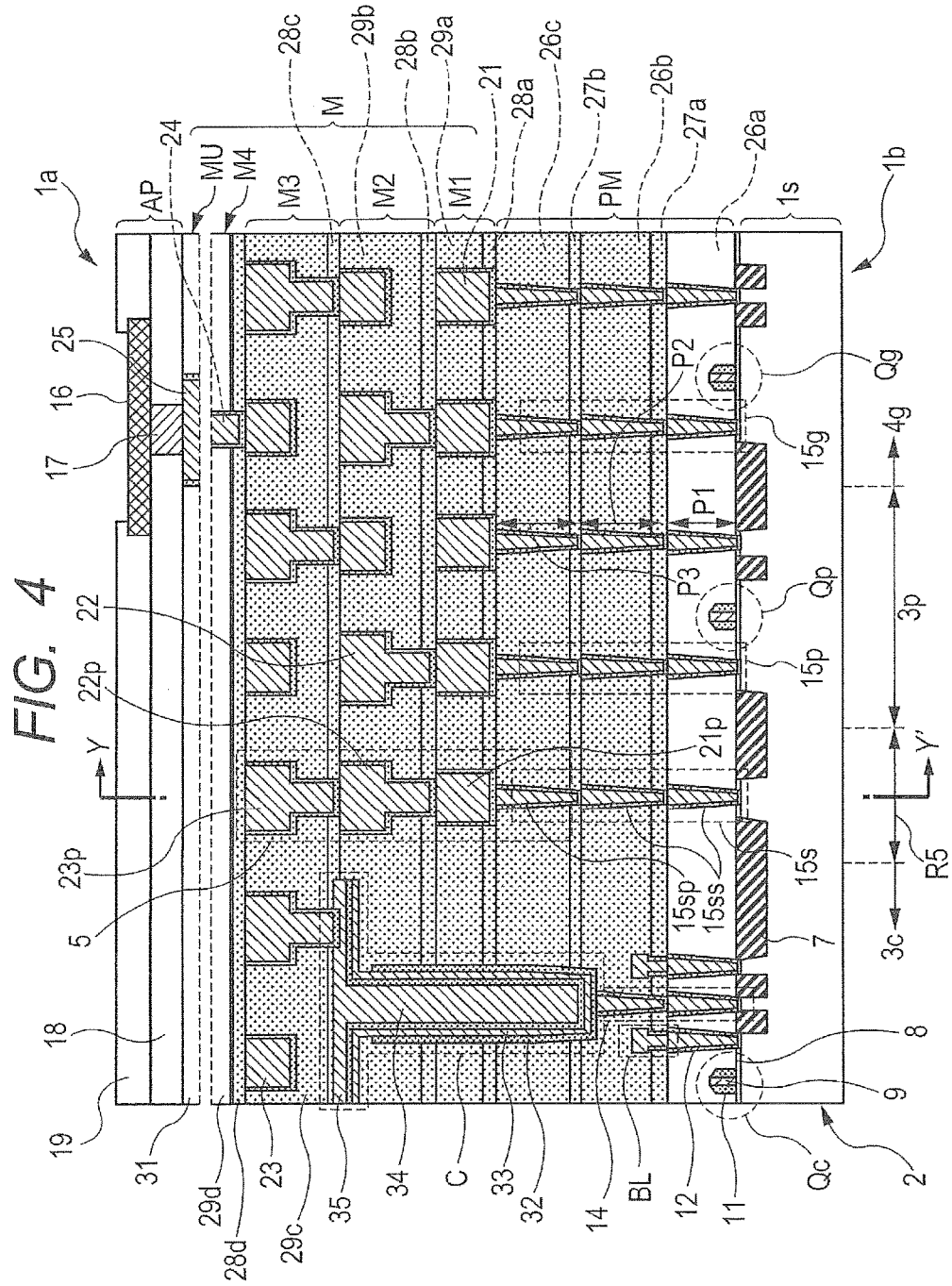
FIG. 4 is a device cross-sectional view almost corresponding to that along A-A' of FIG. 1.
Figure 5:
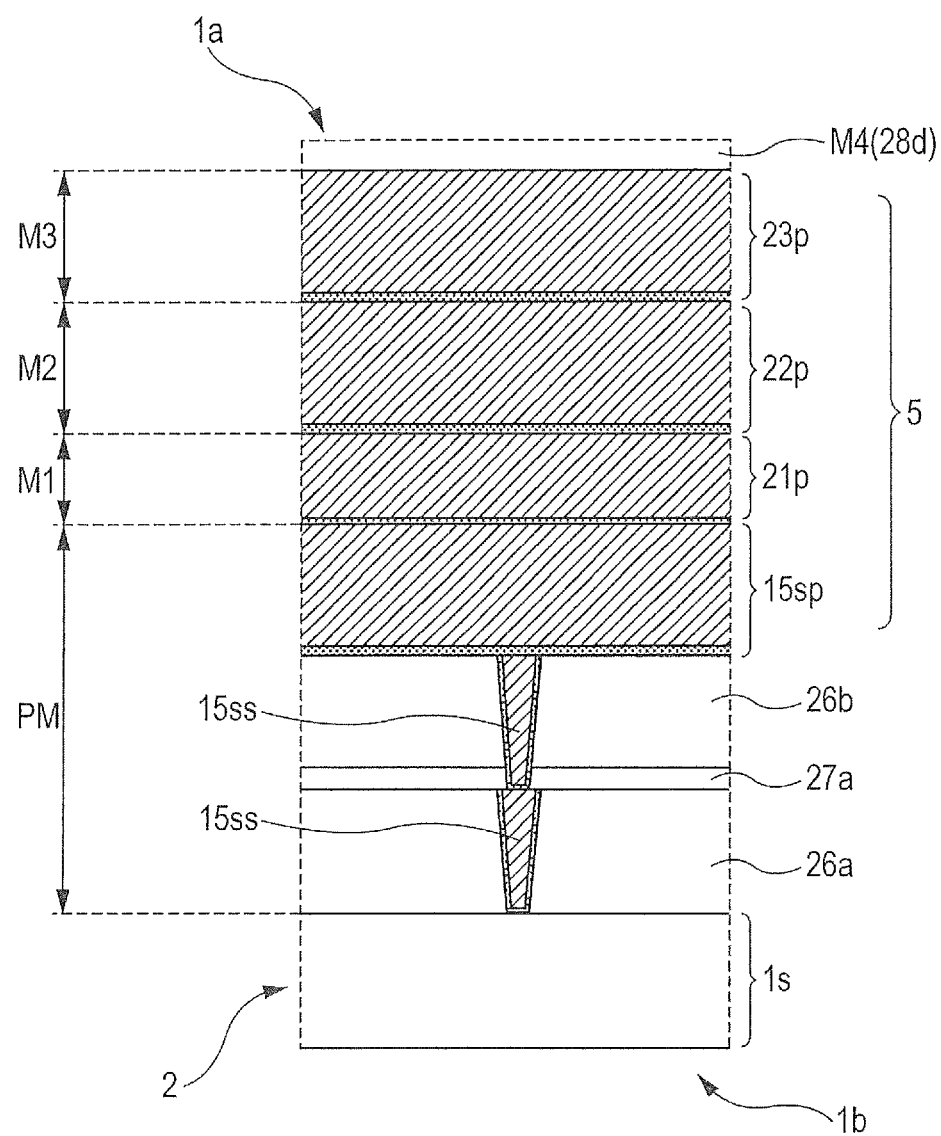
FIG. 5 is a device cross-sectional view corresponding to that along Y-Y' FIG. 4.
Figure 6:
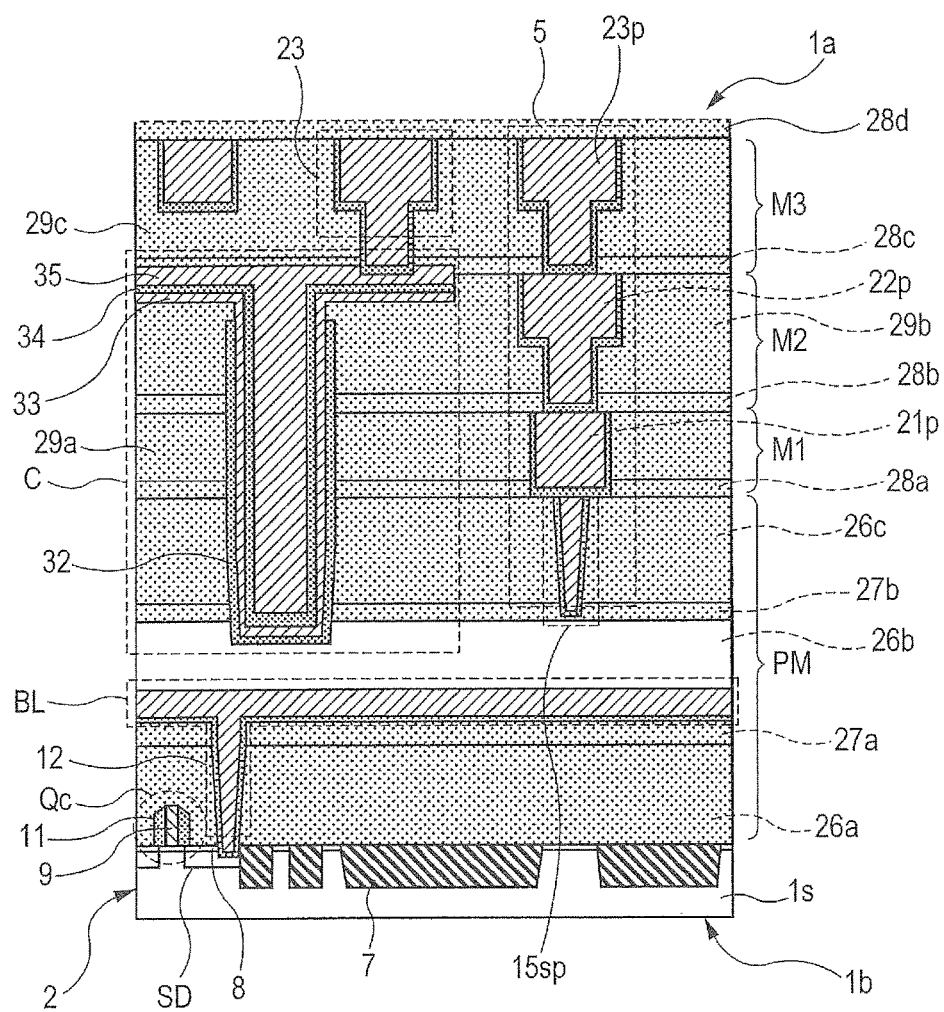
FIG. 6 is a device cross-sectional view almost corresponding to that along B-B' of FIG. 1.
Figure 7:
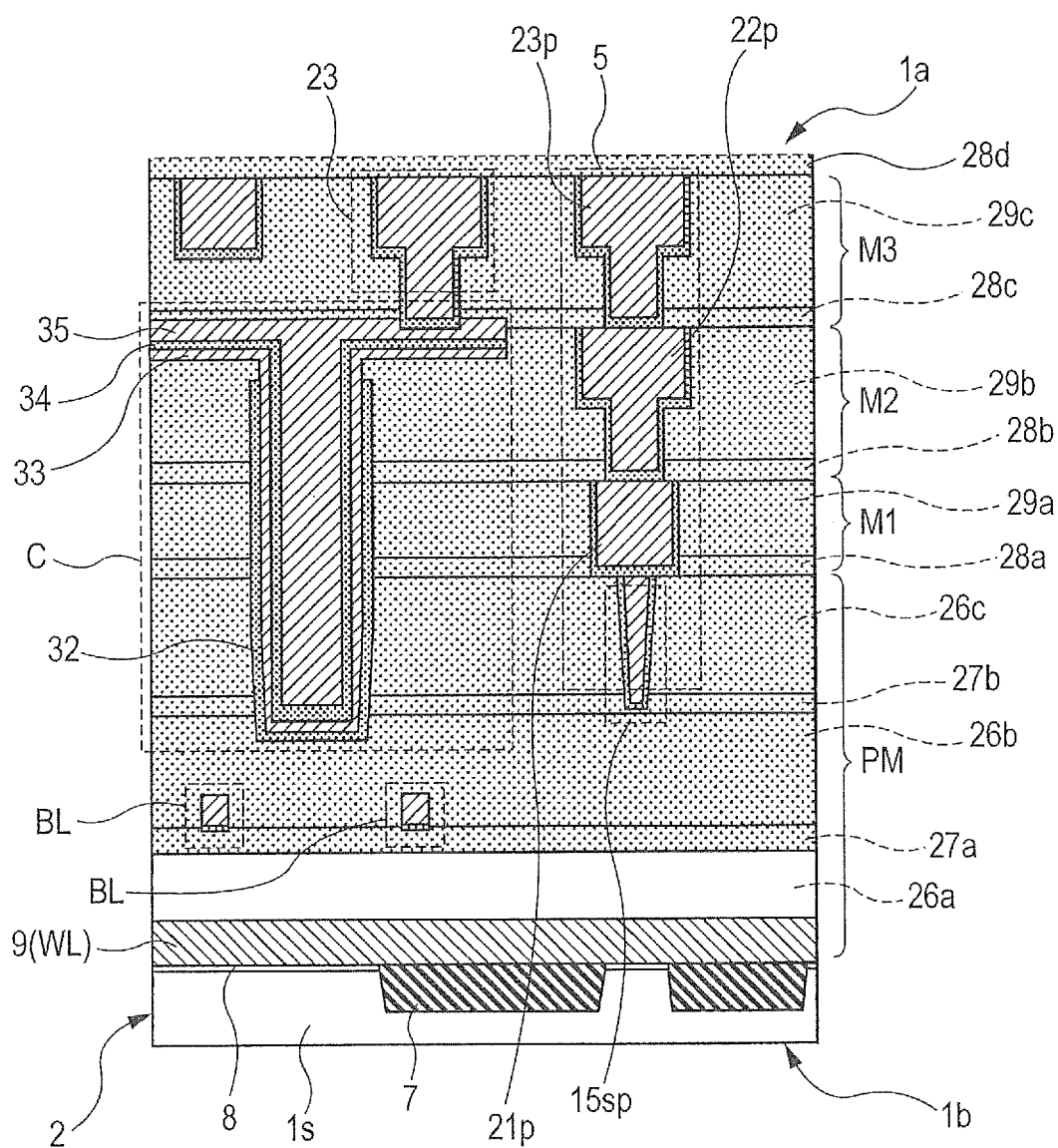
FIG. 7 is a device cross-sectional view almost corresponding to that along C-C' of FIG. 1.
Figure 8:
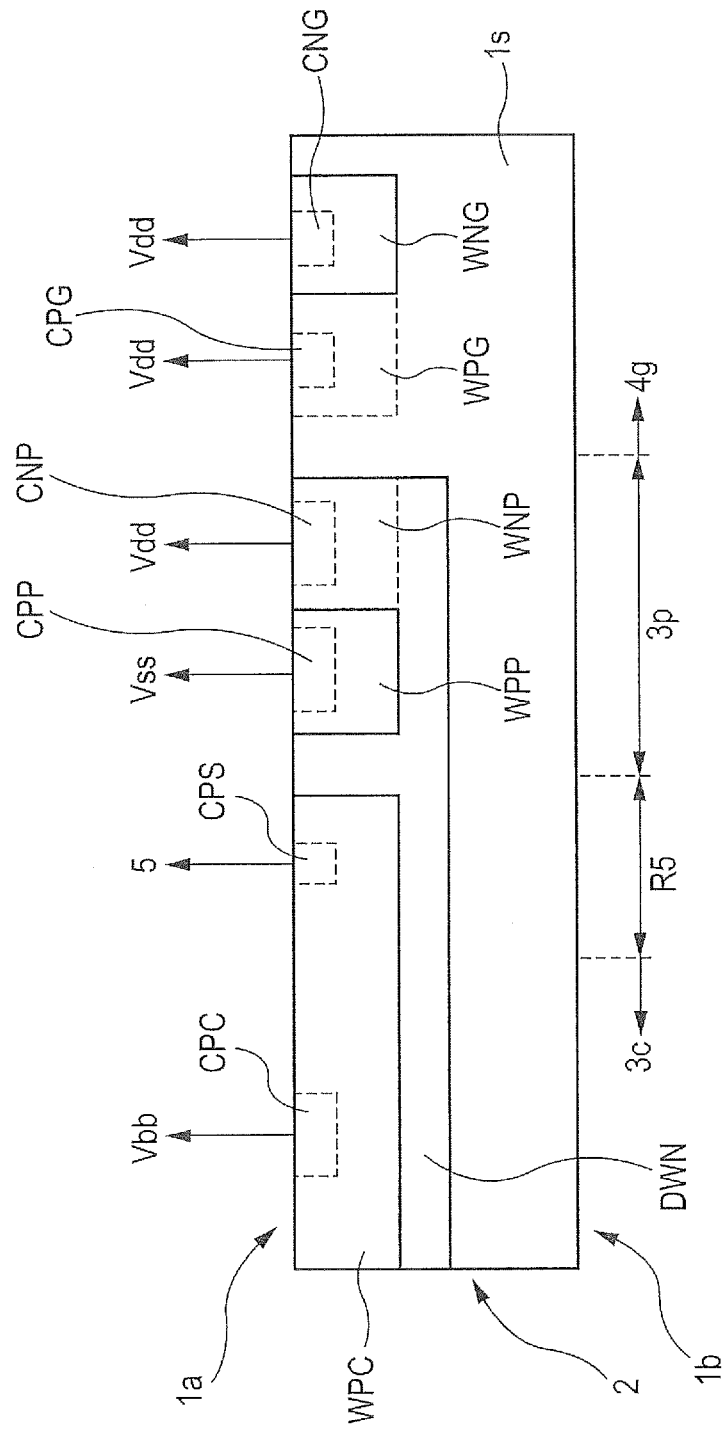
FIG. 8 is a schematic cross-sectional view of a semiconductor substrate part and so on to supplementarily describe an impurity region structure, which is omitted in FIG. 4 and other drawings, in the semiconductor substrate.
Figure 9:
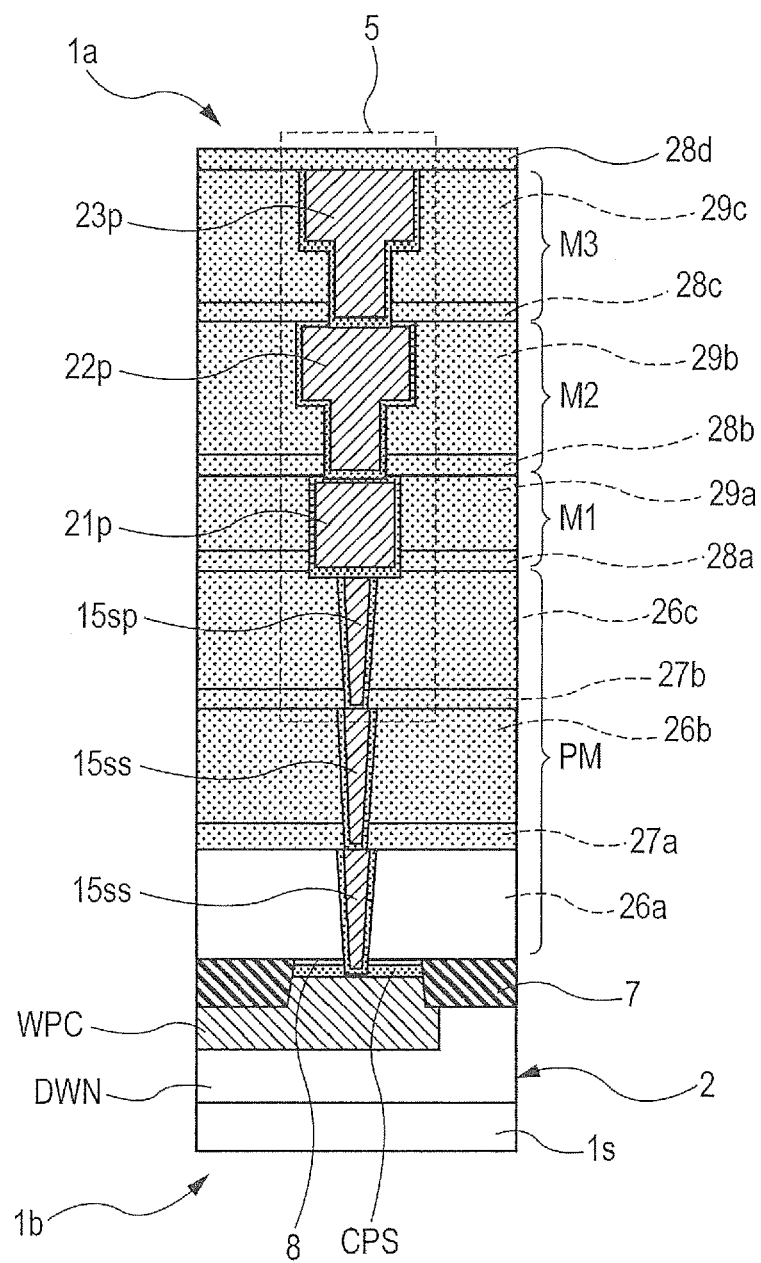
FIG. 9 is a device cross-sectional view showing the detailed structure of a memory-periphery metal seal ring formation area R5 of FIGS. 4 and 8.

FIG. 1 is a top view briefly showing the entire top surface layout of a semiconductor chip to describe the device structure (memory-periphery metal seal ring Vbb coupling structure), layout and other features of an embedded DRAM (i.e., DRAM-embedded logic chip) that is an exemplary semiconductor integrated circuit device according to an embodiment of the present application. FIG. 2 is a schematic circuit diagram of a memory area 3 in FIG. 1. FIG. 3 is a plane layout of a region R1 cut out from the vicinity of a corner of the memory area in FIG. 1. FIG. 4 is a device cross-sectional view almost corresponding to that along A-A' of FIG. 1. FIG. 5 is a device cross-sectional view corresponding to that along Y-Y' FIG. 4. FIG. 6 is a device cross-sectional view almost corresponding to that along B-B' of FIG. 1. FIG. 7 is a device cross-sectional view almost corresponding to that along C-C' of FIG. 1. FIG. 8 is a schematic cross-sectional view of a semiconductor substrate part and so on to supplementarily describe an impurity region structure, which is omitted in FIG. 4 and other drawings, in the semiconductor substrate. FIG. 9 is a device cross-sectional view showing the detailed structure of a memory-periphery metal seal ring formation area R5 of FIGS. 4 and 8. Based on these drawings, the device structure (memory-periphery metal seal ring Vbb coupling structure), layout and other features of an embedded DRAM (i.e., DRAM-embedded logic chip) will be described as an example of the semiconductor integrated circuit device according to the embodiment of the present application.

First, as shown in FIG. 1, a ring-shaped chip-periphery metal seal ring 6 is provided at the outermost edge of the front surface 1a of a semiconductor chip 2. The chip-periphery metal seal ring 6 is, for example, a wall formed by stacking a lower-layer planar W plug (see, e.g., FIG. 4, the same applies to the following cases), planar copper-based metal embedded interconnects in respective layers, an upper-layer planar W plug, a planar aluminum-based interconnect, and so on, and basically having no openings in the upper part thereof over the semiconductor substrate. This chip-periphery metal seal ring 6 is not indispensable, but is effective to prevent, for example, mechanical impact propagation upon dicing and water entry from the periphery.

In an inside area of the front surface 1a of the semiconductor chip 2 provided are a memory area 3 including a DRAM area and other areas and a non-memory area 4g, outside the memory area 3, provided with, for example, a CMOS logic circuit area (logic area), an analogue circuitry area, a memory area of other types (an SRAM area, a nonvolatile memory area), an I/O circuitry area, and an electrode-pad formation area. The memory area 3 is divided into a memory array area 3c with unit memory cells UC (see FIG. 2, the same applies to the following cases) arranged in a matrix and a memory-periphery area 3p. In the memory-periphery area 3p, memory peripheral circuits, such as sense amplifiers SA1, SA2 (see FIG. 2, the same applies to the following cases) and wordline drivers WD1, WD2, WD3, WD4, are provided. The memory-periphery area 3p and the non-memory area 4g are collectively referred to as a non-memory array area 4.

In the memory area 3, a ring-shaped memory-periphery metal seal ring 5 is provided between the memory array area 3c and the memory-periphery area 3p so as to surround the memory array area 3c on a plane. The structure of the memory-periphery metal seal ring 5 is basically the same as the chip-periphery metal seal ring 6, but is different in that the memory-periphery metal seal ring 5 is formed in limited layers in the hierarchy levels of the multi-layered interconnects (including pre-metal regions) and partially has an opening as described later; however, the memory-periphery metal seal ring 5 is shaped like a closed ring when viewed in a plane. The advantage of the memory-periphery metal seal ring 5 is, for example, to prevent etching damage generated during formation of memory capacitance C (see FIG. 4) from spreading to the non-memory array area 4.

FIG. 2 is a schematic circuit diagram of the memory area 3 in FIG. 1. As shown in FIG. 2, in the memory array area 3c, a plurality of wordlines WL1, WL2, WL3, WL4 are arranged in the vertical direction and a plurality of bitlines BL1, BL2, BL3, BL4 are arranged in the horizontal direction so as to intersect the wordlines, respectively, at right angles. In this example, for instance, the respective wordlines WL1, WL2, WL3, WL4 are controlled by wordline drivers WD1, WD2, WD3, WD4 that are alternately disposed on opposite sides of the memory-periphery area 3p with respect to the memory array area 3c. The bitlines BL1, BL2, BL3, BL4 are alternately paired and the pairs of the bitlines are coupled to sense amplifiers SA1, SA2 that are alternately disposed on opposite sides of the memory-periphery area 3p with respect to the memory array area 3c. Needless to say, the arrangement of the wordline drivers WD1, WD2, WD3, WD4 and sense amplifiers SA1, SA2 and the pairing method of the bitlines BL1, BL2, BL3, BL4 are not limited to the arrangement and paring method suggested above.

In the vicinity of predetermined intersection points of the wordlines WL1, WL2, WL3, WL4 and bitlines BL1, BL2, BL3, BL4, a unit memory cell UC composed of a pair of an N-type MISFET (access transistor) Q1, Q2, Q3, Q4, Q5, Q6, Q7, or Q8 and a memory capacitor C1, C2, C3, C4, C5, C6, C7, or C8 is coupled to each of the bitlines and wordlines. In the unit memory cells UC, each of the memory capacitors C1, C2, C3, C4, C5, C6, C7, C8 has a terminal coupled to a plate potential Vp (when using a half precharge scheme, "Vdd/2 potential", that is, ½ potential or midpoint potential of supply potential Vdd).

FIG. 3 is an enlarged plan view of a region R1 cut out from the vicinity of a corner of the memory area in FIG. 1. As shown in FIG. 3, a plurality of memory-array active regions AC are provided in a matrix over the front surface 1a (first main surface) of the semiconductor substrate 1s. Over the front surface 1a of the semiconductor substrate 1s and below the memory-periphery metal seal ring 5, a sealed-ring P-type well contact region CPS (see FIG. 8) is provided to mutually couple the semiconductor substrate 1s and memory-periphery metal seal ring 5, for example, via cylindrical W plugs 15ss and so on. Remaining regions, except for the memory-array active regions AC and sealed-ring P-type well contact region CPS, are, for example, STI (Shallow Trench Isolation) regions 7 (device isolation regions).

Over the front surface 1a of the semiconductor substrate is, for example, a plurality of wordlines WL are arranged in the vertical direction and a plurality of bitlines BL are arranged in the horizontal direction so as to intersect the wordlines WL roughly at right angles. At predetermined portions below these bitlines BL and in the memory-array active regions AC, bitline contact W plugs 12 are provided. In the vicinity of predetermined intersecting points of the wordlines WL and bitlines BL and in the memory-array active regions AC, capacitance contact W plugs 14 are provided, and capacitance's lower electrodes 32 are provided over the capacitance contact W plugs 14. Above these capacitance's lower electrodes 32 provided is a capacitance plate 35 so as to cover almost all the memory array area 3c.

FIG. 4 is a cross-sectional view of a chip taken along A-A' of FIG. 1. As shown in FIG. 4, devices are mainly formed over the front surface 1a (first main surface), which is the opposite side of a back surface 1b (second main surface), of the semiconductor substrate 1s (e.g., P-type monocrystalline silicon substrate). In this cross section of the front surface 1a of the semiconductor substrate 1s (semiconductor chip 2), a memory array area 3c, a memory-periphery metal seal ring formation area R5, a memory-periphery area 3p, and a non-memory area 4g are provided. In the front surface 1a of the semiconductor substrate 1s, STI regions 7 and a gate insulating film 8 are provided. Gate electrodes 9, sidewalls 11 and other elements are provided over the gate insulating film 8 to form gate structures that function as a MISFET (Qc) in the memory array area, a MISFET (Qg) in the non-memory area, a MISFET (Qp) in the memory-peripheral area, and so on. The gate electrode 9 can be made of any suitable materials, but in this example, the gate electrode 9 is made by subjecting the surface of the polysilicon gates (transistors Qc, Qg, Qp) to silicidation into nickel-based silicide, for example, as with the case of a source and drain. Generally, stand-alone DRAMs do not include silicide memory array that entails leakage problems; however, this example refers to embedded DRAMs that do not induce serious leakage increases caused by silicidation. Accordingly, simplification of the process and reduction in resistance of the wordlines can be achieved. If required, silicidation of the transistor Qc is avoidable. In addition to nickel base, preferable metals for silicidation include, for example, titanium base, tungsten base, platinum base, cobalt base, and compounds thereof.

Over the front surface 1a of the semiconductor substrate 1s provided is a pre-metal region PM composed of three layers of pre-metal main insulating films 26a, 26b, 26c (e.g., non-Low-k insulating films mainly composed of silicon oxide-based insulating films), and pre-metal auxiliary insulating films 27a, 27b interposed therebetween in this example. When required to particularly distinguish the layers, the three layers are referred to as a lower pre-metal sub-region P1, an intermediate pre-metal sub-region P2 and an upper pre-metal sub-region P3, respectively. The pre-metal auxiliary insulating film 27a is, for example, a non-Low-k silicon oxide-based insulating film, while the pre-metal auxiliary insulating film 27b is preferably a non-Low-k insulating film, such as SiON (or SiN, SiCN, etc.), to be used as an etch stop film, for example. For the pre-metal main insulating films 26a, 26b, a non-Low-k insulating film mainly composed of a silicon oxide-based insulating film formed by HDP (High Density Plasma) can be shown as a suitable material by example. Furthermore, for the pre-metal main insulating film 26c, a non-Low-k insulating film mainly composed of a silicon oxide-based insulating film formed by plasma CVD with TEOS base can be shown as a suitable material by example.

In the pre-metal main insulating film 26a, bitline contact W plugs 12, capacitance contact W plugs 14, cylindrical W plugs 15ss, bypass contact W plugs 15p (15g, 15s) and other elements are embedded. These tungsten plugs include, for example, a titanium film, a titanium nitride film and other films disposed from the lower layer to serve as a barrier metal film and so on; however, this description does not make reference to it for its complexity unless otherwise needed. Reference will also not be made to a tantalum-based barrier film (tantalum nitride film, etc.), a titanium-based barrier film (titanium nitride film, etc.) and the like involved in copper embedded interconnects.

Likewise, in the pre-metal auxiliary insulating film 27a and pre-metal main insulating film 26b, the capacitance contact W plug 14, cylindrical W plugs 15ss, bypass contact W plugs 15p and bitlines EL (interconnects mainly composed of tungsten films), which are not embedded interconnects for example, are formed.

In the pre-metal auxiliary insulating film 27b and pre-metal main insulating film 26c in a range of the memory-periphery metal seal ring formation area R5, memory-periphery area 3p, and non-memory area 4g, planar W plugs 15sp and bypass contact W plugs 15p are embedded.

A multi-layered embedded metal interconnection layer M is formed over the pre-metal region PM and includes, for example, a first embedded metal interconnection layer M1, a second embedded metal interconnection layer M2, a third embedded metal interconnection layer M3, a fourth embedded metal interconnection layer M4, and an uppermost embedded metal interconnection layer MU. The insulating films include, for example, insulative diffusion barrier films 28a, 28b, 28c, 28d, a non-porous Low-k main interlayer insulating film 29a and porous Low-k main interlayer insulating films 29b, 29c interposed between the insulative diffusion barrier films, and a non-Low-k main interlayer insulating film 29d and a non-Low-k uppermost main interlayer insulating film 31 disposed over the insulative diffusion barrier film 28d. A suitable material of the insulative diffusion barrier film 28a may be, for example, SiCN (or SiN). A suitable material of the non-porous Low-k main interlayer insulating film 29a may be, for example, a non-porous SiOC film. A suitable material of the porous Low-k main interlayer insulating films 29b, 29c may be, for example, a porous SiOC film (e.g., molecular-pore-stack SiOC film, the same applies to the following cases). Furthermore, a suitable material of the non-Low-k main interlayer insulating film 29d and non-Low-k uppermost main interlayer insulating film 31 may be, for example, a non-Low-k insulating film mainly composed of a silicon oxide-based insulating film formed by plasma CVD with TEOS base.

In the insulative diffusion barrier film 28a and non-porous Low-k main interlayer insulating film 29a in a range of the memory-periphery metal seal ring formation area R5, memory-periphery area 3p, and non-memory area 4g, first-layer embedded metal interconnects 21 including a planar first-layer embedded metal interconnect 21p are embedded. These first-layer embedded metal interconnects 21 are, for example, copper-based embedded interconnects formed by a single damascene method.

Likewise, in the insulative diffusion barrier film 28b and porous Low-k main interlayer insulating film 29b in a range of the memory-periphery metal seal ring formation area R5, memory-periphery area 3p, and non-memory area 4g, second-layer embedded metal interconnects 22 (including vias) including a planar second-layer embedded metal interconnect 22p (including vias) are embedded. These second-layer embedded metal interconnects 22 may be, for example, copper-based embedded interconnects formed by a dual damascene method.

Furthermore, in the insulative diffusion barrier film 28c and porous Low-k main interlayer insulating film 29c in a range of the memory-periphery metal seal ring formation area R5, memory-periphery area 3p, and non-memory area 4g, third-layer embedded metal interconnects 23 (including vias) including a planar third-layer embedded metal interconnect 23p (including vias) are embedded.

Over the porous Low-k main interlayer insulating film 29c, for example, an insulative diffusion barrier film 28d is provided and a non-Low-k main interlayer insulating film 29d is further provided over the insulative diffusion barrier film 28d. A suitable material of the insulative diffusion barrier film 28d may be, for example, SiCN (or SiN). A suitable material of the non-Low-k main interlayer insulating film 29d may be, for example, a non-Low-k insulating film mainly composed of a silicon oxide-based insulating film formed by plasma CVD with TEOS base. In the insulative diffusion barrier film 28d and non-Low-k main interlayer insulating film 29d in a range of the memory-periphery metal seal ring formation area R5, memory-periphery area 3p, and non-memory area 4g, for example, a fourth-layer embedded metal interconnect 24 (including vias) is embedded. The fourth-layer embedded metal interconnect 24 is, for example, a copper-based embedded interconnect formed by a dual damascene method.

Above the non-Low-k main interlayer insulating film 29d, a non-Low-k uppermost main interlayer insulating film 31 and other films are provided. In the non-Low-k uppermost main interlayer insulating film 31, for example, a copper-based embedded interconnect, that is, an uppermost-layer embedded metal interconnect 25 (including vias) is embedded by the dual damascene method. A suitable material of the non-Low-k uppermost main interlayer insulating film 31 may be, for example, a non-Low-k insulating film mainly composed of a silicon oxide-based insulating film formed by plasma CVD with TEOS base. In this example, an interlayer insulating film between the non-Low-k main interlayer insulating film 29d and the non-Low-k uppermost main interlayer insulating film 31 is a non-Low-k silicon-based insulating film. In other words, Low-k main interlayer insulating films are not used.

Over the non-Low-k uppermost main interlayer insulating film 31, for example, a pad metal interconnection layer AP is provided. The insulating film includes, for example, an under-pad interlayer insulating film 18 in the lower layer and a final passivation film 19 in the upper layer. A suitable material of the under-pad interlayer insulating film 18 may be, for example, a non-Low-k insulating film mainly composed of a silicon oxide-based insulating film formed by plasma CVD with TEOS base. Similarly, a suitable material of the final passivation film 19 may be, for example, a non-Low-k insulating film mainly composed of a silicon oxide-based insulating film formed by plasma CVD with TEOS base. In addition, the final passivation film 19 can be a silicon nitride-based insulating film, instead of the silicon oxide-based insulating film, or a film stack of the silicon oxide-based insulating film and the silicon nitride-based insulating film. Furthermore, the final passivation film 19 does not need to be an inorganic-based final passivation film alone, but can be an inorganic-based final passivation film with an organic-based final passivation film, such as a polyimide film, stacked thereon.

A tungsten plug 17 is embedded in the under-pad interlayer insulating film 18 and an electrode pad 16 is provided over the under-pad interlayer insulating film 18 as a part of an aluminum-based interconnection layer, for example. The final passivation film 19 has a pad opening over the electrode pad 16. The interconnect of the pad layer may be an aluminum-based non-embedded interconnect, a copper embedded interconnect, a tungsten interconnect, or other types of metal interconnects.

In the pre-metal auxiliary insulating film 27a and pre-metal main insulating film 26b within the memory array area 3c, for example, bitlines BL (e.g., mainly made of tungsten), which are non-embedded interconnects, are provided. In the pre-metal auxiliary insulating film 27a and pre-metal main insulating film 26b within the memory array area 3c, for example, a capacitor contact W plug 14 is embedded.

In this example, a memory capacitor C is embedded in insulating films ranging from the pre-metal main insulating film 26b to the insulative diffusion barrier film 28c within the memory array area 3c. The memory capacitor C has, for example, a so-called MIM (Metal Insulator Metal) structure that includes an individually separated capacitance's lower electrode 32 (e.g., a titanium nitride film) disposed at the lowest part. A capacitance insulating film 33 (e.g., a zirconium oxide film) is formed over the capacitance's lower electrode 32, a capacitance's upper electrode 34 (e.g., titanium nitride film) is formed over the capacitance insulating film 33 so as to integrally cover a plurality of cells, and a capacitance plate 35 (tungsten film) integrally covers the capacitance's upper electrode 34. The capacitance insulating film 33 may be a zirconium oxide film, a single layer film of alumina, tantalum oxide or other materials, or a composite film thereof.

As described above, in the memory-periphery metal seal ring formation area R5, a memory-periphery metal seal ring 5 is provided across from the upper pre-metal sub-region P3 in the pre-metal region PM to the third embedded metal interconnection layer M3. The memory-periphery metal seal ring 5 in this example is provided to prevent adjacent areas from being damaged caused by etching or other processing to form the memory capacitor C extending across from the intermediate pre-metal sub-region P2 in the pre-metal region PM to the third embedded metal interconnection layer M3. In this example, the main interlayer insulating films in the first embedded metal interconnection layer M1 to the third embedded metal interconnection layer M3 are Low-k insulating films, while the interlayer insulating films in the second embedded metal interconnection layer M2 and the third embedded metal interconnection layer M3 are porous Low-k insulating films. Compared with non-Low-k insulating films, Low-k insulating films are generally likely to transfer the components of process gas, process liquid, and so on to adjacent areas thereof, and the tendency is further remarkable in porous Low-k insulating films. Thus, the memory-periphery metal seal ring 5 is indispensable for interconnection layers including the porous Low-k insulating films and is desirable for interconnection layers including non-porous Low-k insulating films (the first embedded metal interconnection layer M1 in this example). With consideration given to the memory capacitor C formed across the intermediate pre-metal sub-region P2 in the pre-metal region PM, it is desirable to provide the memory-periphery metal seal ring 5 also in the upper pre-metal sub-region P3 in the pre-metal region PM, for example, to prevent downward transfer of hazardous substances. Note that provision of the memory-periphery metal seal ring 5 is desired regardless of whether the memory capacitor C is present in interconnection layers including Low-k insulating films because there is a possibility that hazardous substances or the like may be transferred through the upper and lower layers of the interconnection layers.

Repeating the above description, this example employs low-dielectric constant interlayer insulating films for the main interlayer insulating films in the first embedded metal interconnection layer M1 to the third embedded metal interconnection layer M3 and a memory capacitor C formed across the hierarchy levels at least from the first embedded metal interconnection layer M1 to the third embedded metal interconnection layer M3. Accordingly, the memory-periphery metal seal ring 5 is provided between the memory array area 3 and the non-memory array area 4 so as to surround the memory array area 3 and extends across the embedded metal interconnection layers including at least the low-dielectric constant interlayer insulating films (i.e., in the same hierarchy levels). This can reduce damage (including secondary damage arising from initial damage) caused by processing for the memory capacitor C, or a memory capacitance C, to the non-memory array area.

Further detailed description about the structure of the memory-periphery metal seal ring 5 will be now made by showing a cross section in FIG. 5 taken along Y-Y' of FIG. 4. As shown in FIG. 5, a planar W plug 15sp, a planar first-layer embedded metal interconnect 21p, a planar second-layer embedded metal interconnect 22p (including vias) and a planar third-layer embedded metal interconnect 23p (including vias) make up a wall-like memory-periphery metal seal ring 5. The memory-periphery metal seal ring 5 is not present in the intermediate sub-region and lower sub-region of the pre-metal region PM, but cylindrical W plugs 15ss are present. This is because the insulating films in the pre-metal region PM are non-Low-k insulating films and bitlines or the like (the same is applied to the wordlines) need to pass through the sub-regions, and so on. As long as the wall-like memory-periphery metal seal ring 5 does not obstruct the bitlines to pass through the intermediate and lower sub-regions of the pre-metal region PM, it is possible to form the memory-periphery metal seal ring 5 in the sub-regions.

FIG. 6 shows a cross section taken along B-B' of FIG. 1. As shown in this cross section of FIG. 6, there is no cylindrical W plug 15ss and other elements under the memory-periphery metal seal ring 5 in order to allow the bitlines BL to pass therethrough. As also shown in FIG. 4, the capacitance plate 35 is coupled to, for example, a predetermined plate potential Vp (Vdd/2 potential) via a third-layer embedded metal interconnect 23 (including vias).

FIG. 7 shows a cross section taken along C-C' of FIG. 1. As shown in the cross section of FIG. 7, a gate electrode 9 of a MISFET (Qc) in the memory array area, that is a wordline WL, is extended so as to pass through below the memory-periphery metal seal ring 5.

FIG. 8 now illustrates an exemplary correlation of impurity regions of the semiconductor substrate 1s corresponding to that in FIG. 4. As shown in FIG. 8, in this example, a deep N-type well region DWN is provided in the memory array area 3c, memory-periphery metal seal ring formation area R5, and memory-periphery area 3p of the front surface 1a of the P-type monocrystalline silicon substrate 1s. At the front surface 1a of the deep N-type well region DWN, a memory-array P-type well region WPC accommodating an N-channel MISFET of the memory array, a memory-periphery P-type well region WPP accommodating an N-channel MISFET of a memory periphery circuit, and a memory-periphery N-type well region WNP accommodating a P-channel MISFET of the memory periphery circuit are formed. In the non-memory area 4g (e.g., logic area) of the front surface 1a of the P-type monocrystalline silicon substrate 1s, a non-memory P-type well region WPG accommodating an N-channel MISFET and a non-memory N-type well region WNG accommodating a P-channel MISFET are directly formed in the P-type monocrystalline silicon substrate 1s. The non-memory P-type well region WPG and non-memory N-type well region WNG may be formed, for example, in another deep N-type well region independent of the deep N-type well region DWN.

With reference to FIG. 8, the relationship between each impurity region and the potential will be described. As shown in FIG. 8, in this example, the P-type monocrystalline silicon substrate 1s and non-memory P-type well region WPG are coupled to a ground potential Vss via a non-memory P-type well contact region CPG of the front surface 1a in the non-memory P-type well region WPG. On the other hand, the non-memory N-type well region WNG is coupled to, for example, a supply potential Vdd via the non-memory N-type well contact region CNG of the front surface 1a.

The deep N-type well region DWN is coupled to, for example, a supply potential Vdd via the memory-periphery N-type well contact region CNP of the front surface 1a in the memory-periphery N-type well region WNP so as to electrically isolate the internal portion of the deep N-type well region DWN from the external portion. The memory-periphery P-type well region WPP in the deep N-type well region DWN is coupled to, for example, a ground potential Vss via a memory-periphery P-type well contact region CPP of the front surface 1a.

The memory-array P-type well region WPC in the deep N-type well region DWN is coupled to, for example, a back-bias potential Vbb via the memory-array P-type well contact region CPC of the front surface 1a to apply back bias to the MISFET (Qc), or N-channel access transistors Q1, Q2, Q3, Q4, Q5, Q6, Q7, Q8, in the memory array area, for example. In this example, the ground potential Vss is defined as a reference potential, and therefore the supply potential Vdd is, for example, around 1 volt, while the back bias potential Vbb is, for example, around −1 volt.

According to the example, the memory-periphery metal seal ring 5 is coupled to, for example, the back bias potential Vbb via, for example, the sealed-ring P-type well contact region CPS of the front surface 1a in the memory-array P-type well region WPC. This configuration is shown in the cross-sectional (enlarged cross-sectional) view in FIG. 9 in the same manner as the memory-periphery metal seal ring formation area R5 of FIG. 4. As appreciated from FIG. 9, the memory-periphery metal seal ring 5 is coupled to the sealed-ring P-type well contact region CPS via two cylindrical W plugs 15ss.

A merit of coupling the memory-periphery metal seal ring 5 to the back bias potential Vbb is that, for example, the memory-periphery metal seal ring 5 can be used as a well contact with the back bias. Coupling the memory-periphery metal seal ring 5 to any of the potentials of the substrate has a merit in potential stabilization, reduction of noise propagation and so on.

2. Description of an Exemplary Manufacturing Process of the Semiconductor integrated circuit device according to the embodiment of the Present Invention (Mainly from FIGS. 10 to 22)

The manufacturing process, which will be described in this section, is an example corresponding to the device structure described in Section 1; however, it is needless to say that various changes and modifications can be added. Since this manufacturing process is basically applicable to the structures described in Section 3 and Section 4 almost as it is, the corresponding manufacturing process for the sections will not be iterated in principle.

A specific description will be made below with a gate first process for polysilicon gate structure as an example; however, it is needless to say that a gate first process for metal gate structure, a gate last process or processes therebetween can be used as the example.

Figure 10:
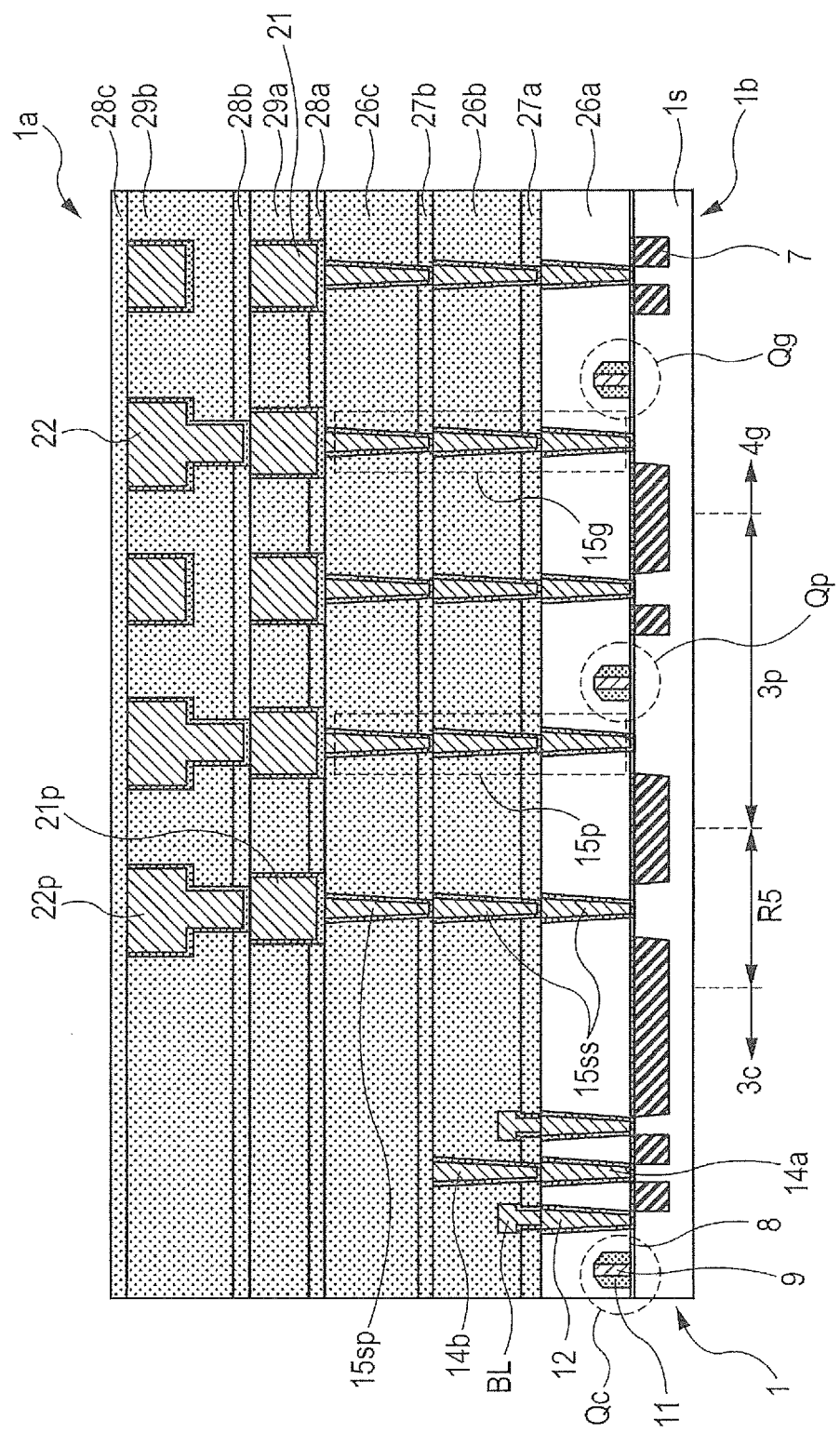
FIG. 10 is a cross-sectional view, corresponding to that in FIG. 4, of a wafer in the middle of a manufacturing process (at the completion of a step of forming an insulative diffusion barrier film 28c of a third embedded metal interconnection layer M3) to describe an exemplary manufacturing process of the semiconductor integrated circuit device according to the embodiment of the present application.

FIG. 10 is a cross-sectional view, corresponding to that in FIG. 4, of a wafer in the middle of a manufacturing process (at the completion of a step of forming an insulative diffusion barrier film 28c of a third embedded metal interconnection layer M3) to describe an exemplary manufacturing process of the semiconductor integrated circuit device according to the embodiment of the present application.

Figure 11:
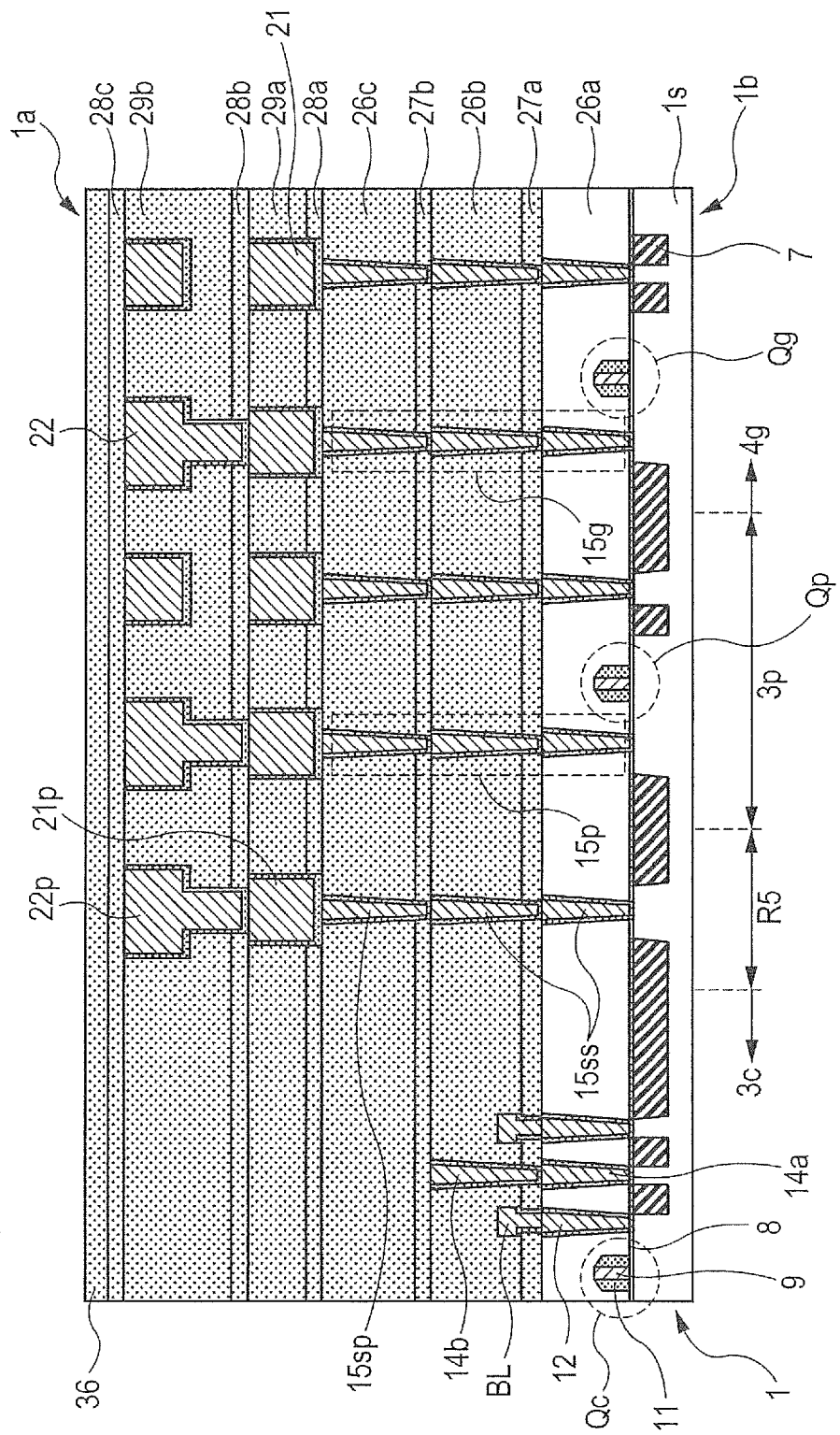
FIG. 11 is a cross-sectional view, corresponding to that in FIG. 4, of the wafer in the middle of the manufacturing process (at the completion of the step of forming the insulative diffusion barrier film 28c of the third embedded metal interconnection layer M3) to describe the exemplary manufacturing process of the semiconductor integrated circuit device according to the embodiment of the present application.
Figure 12:
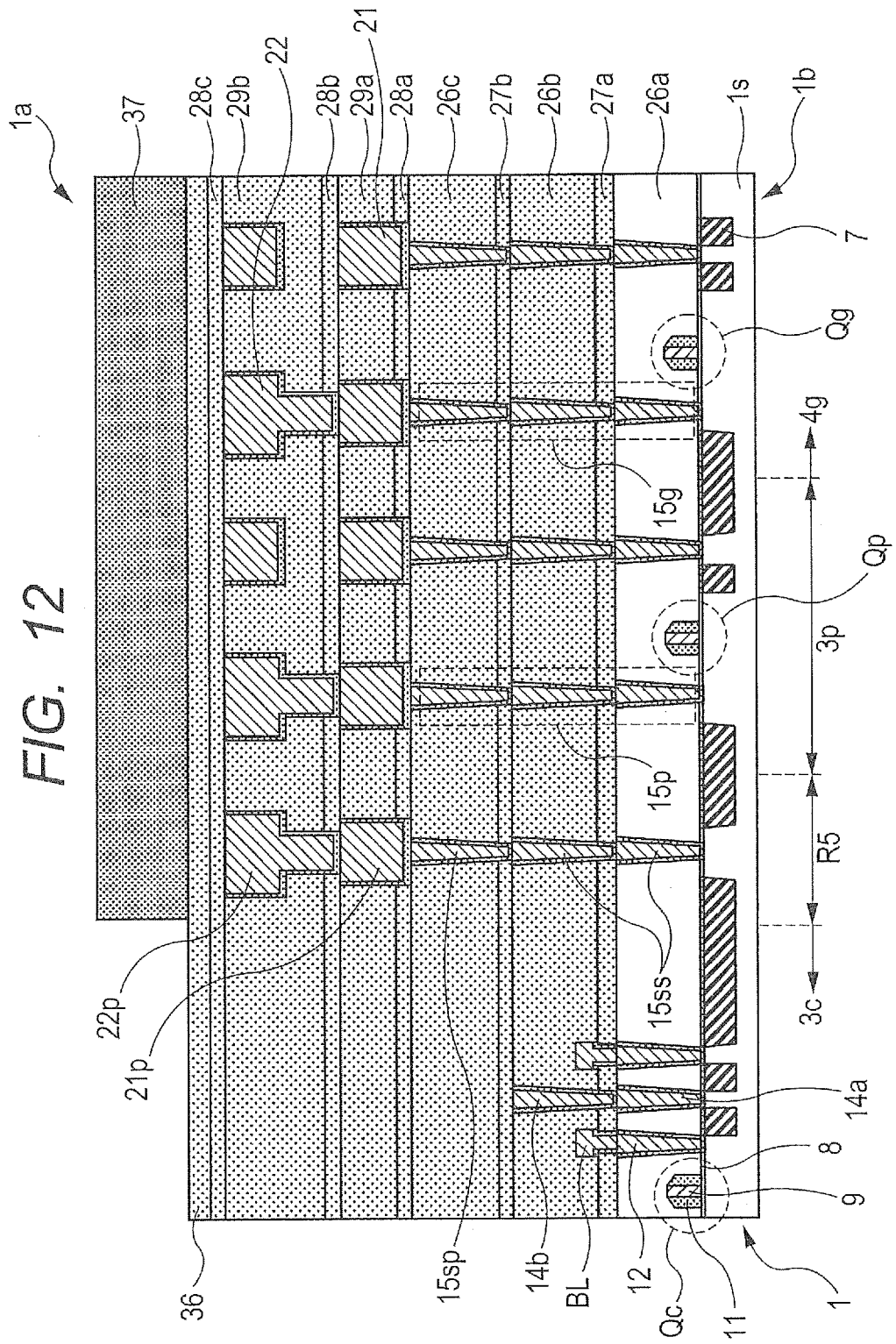
FIG. 12 is a cross-sectional view, corresponding to that in FIG. 4, of the wafer in the middle of the manufacturing process (at the completion of a step of patterning a resist film 37 for forming a recess to accommodate a plate) to describe the exemplary manufacturing process of the semiconductor integrated circuit device according to the embodiment of the present application.
Figure 13:
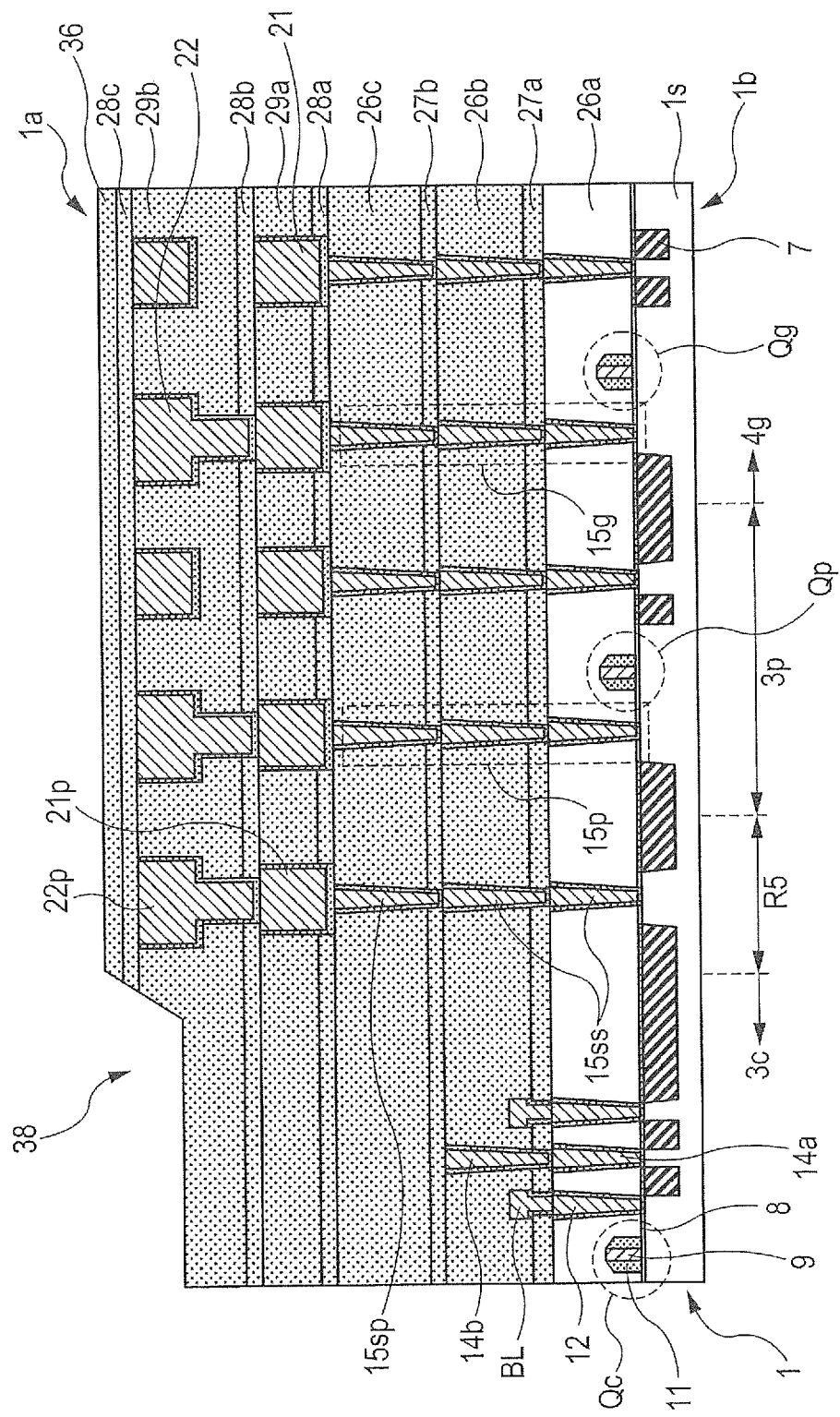
FIG. 13 is a cross-sectional view, corresponding to that in FIG. 4, of the wafer in the middle of the manufacturing process (at the completion of a step of forming a plate accommodation recess 38) to describe the exemplary manufacturing process of the semiconductor integrated circuit device according to the embodiment of the present application.
Figure 14:
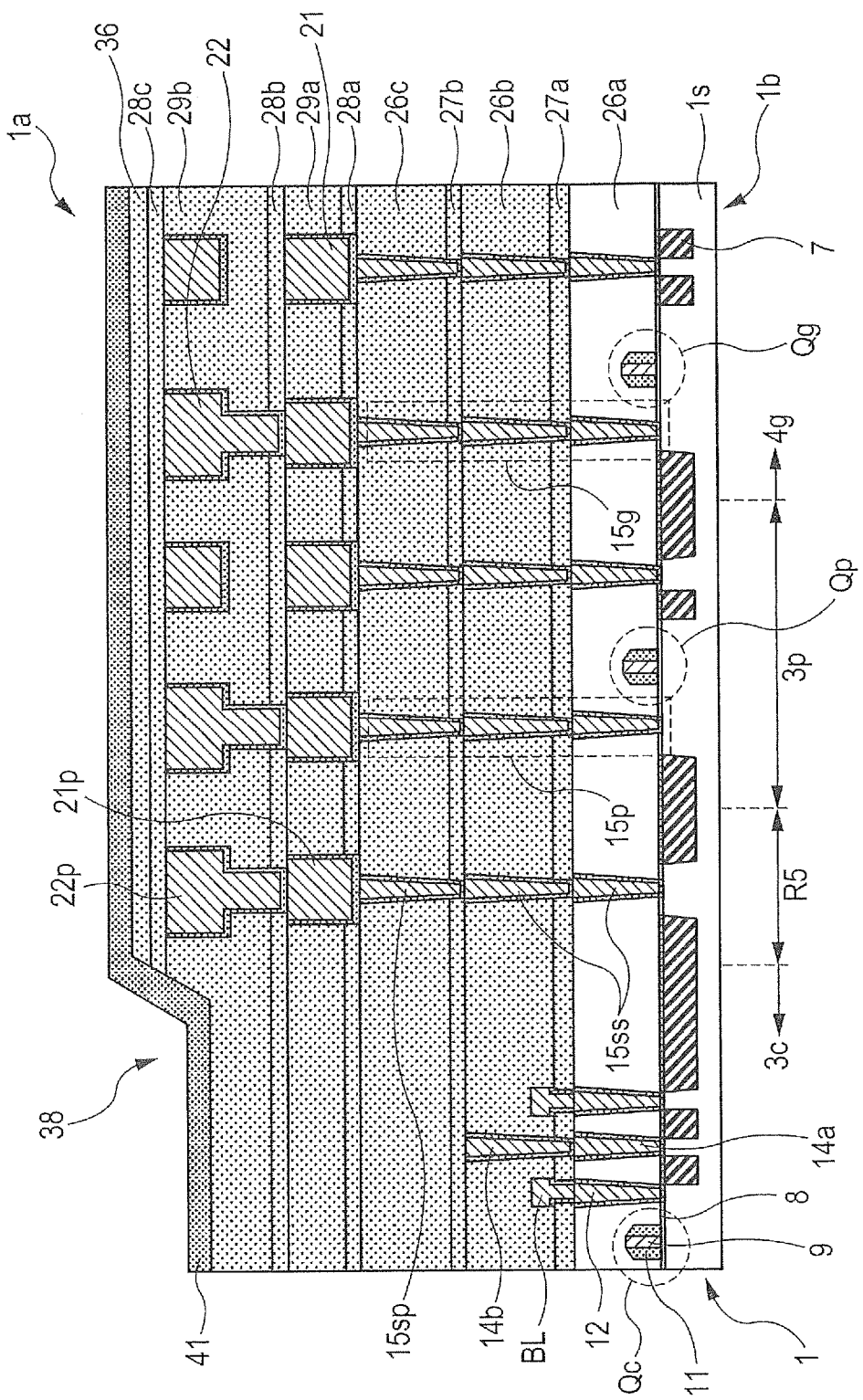
FIG. 14 is a cross-sectional view, corresponding to that in FIG. 4, of the wafer in the middle of the manufacturing process (at the completion of a step of forming a base protective film 41) to describe the exemplary manufacturing process of the semiconductor integrated circuit device according to the embodiment of the present application.
Figure 15:
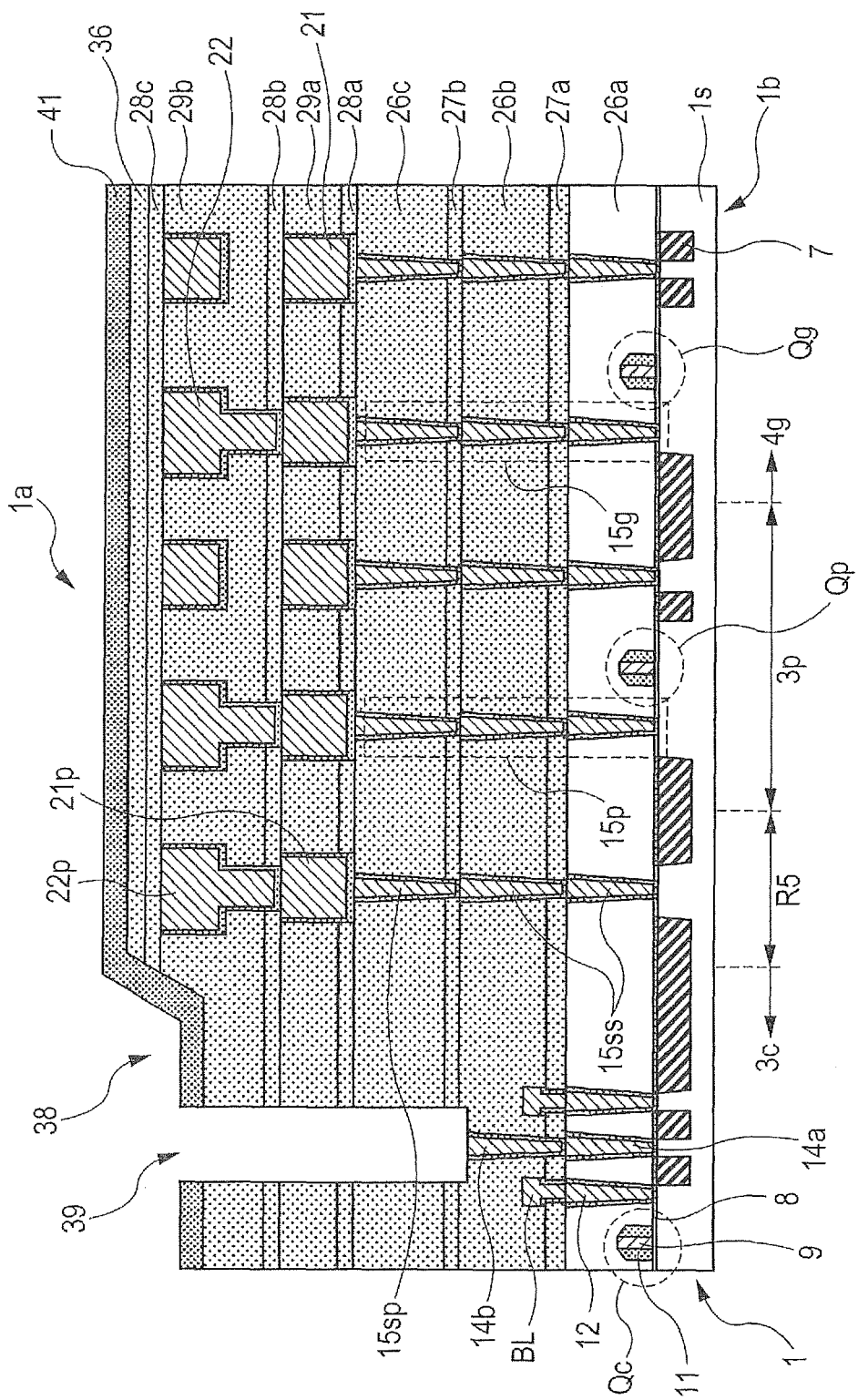
FIG. 15 is a cross-sectional view, corresponding to that in FIG. 4, of the wafer in the middle of the manufacturing process (at the completion of a step of forming a capacitor hole 39) to describe the exemplary manufacturing process of the semiconductor integrated circuit device according to the embodiment of the present application.
Figure 16:
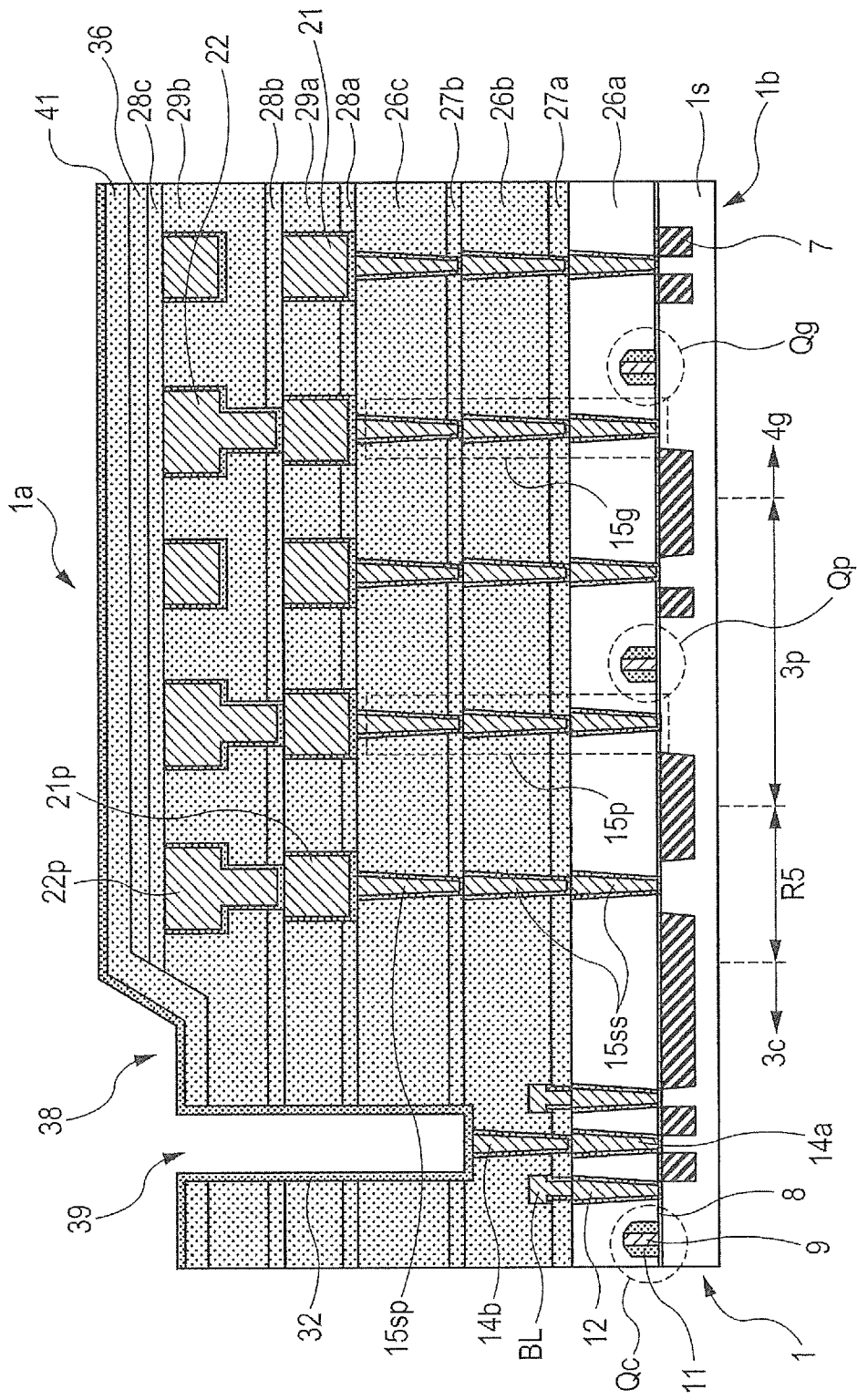
FIG. 16 is a cross-sectional view, corresponding to that in FIG. 4, of the wafer in the middle of the manufacturing process (at the completion of a step of forming a capacitance's lower electrode film) to describe the exemplary manufacturing process of the semiconductor integrated circuit device according to the embodiment of the present application.
Figure 17:
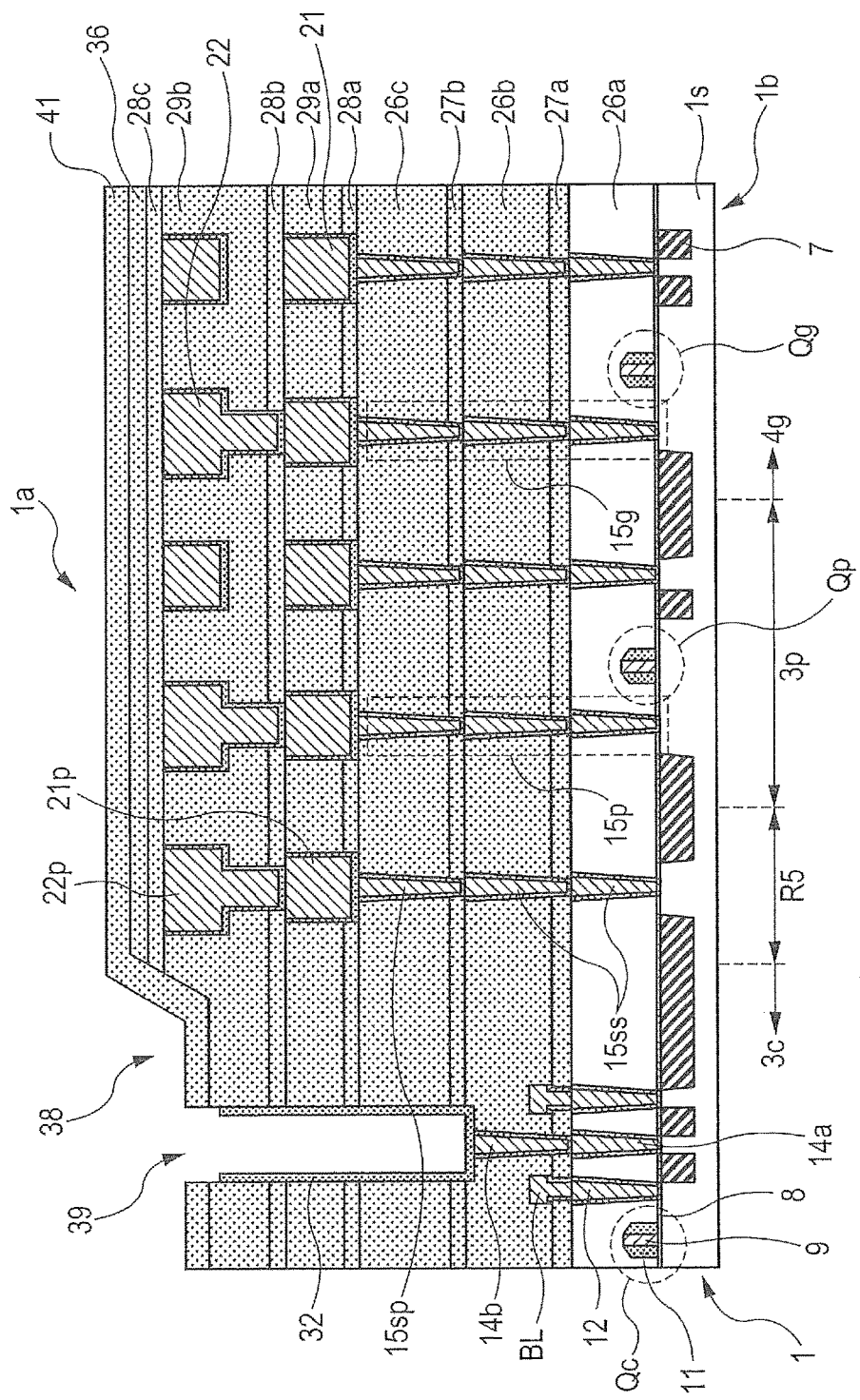
FIG. 17 is a cross-sectional view, corresponding to that in FIG. 4, of the wafer in the middle of the manufacturing process (at the completion of a step of patterning the film into a capacitance's lower electrode) to describe the exemplary manufacturing process of the semiconductor integrated circuit device according to the embodiment of the present application.
Figure 18:
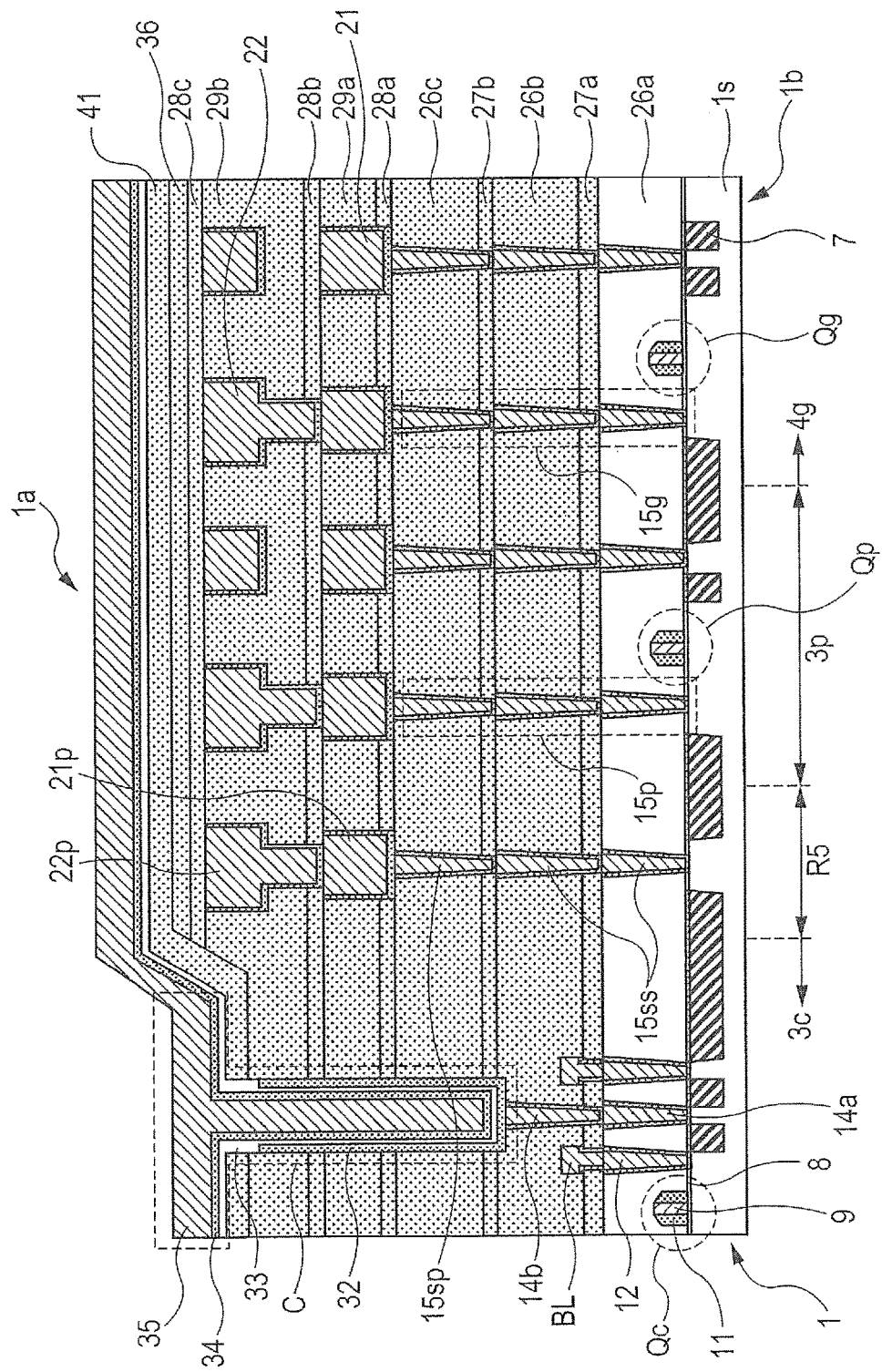
FIG. 18 is a cross-sectional view, corresponding to that in FIG. 4, of the wafer in the middle of the manufacturing process (at the completion of a step of forming a capacitance's plate film) to describe the exemplary manufacturing process of the semiconductor integrated circuit device according to the embodiment of the present application.
Figure 19:
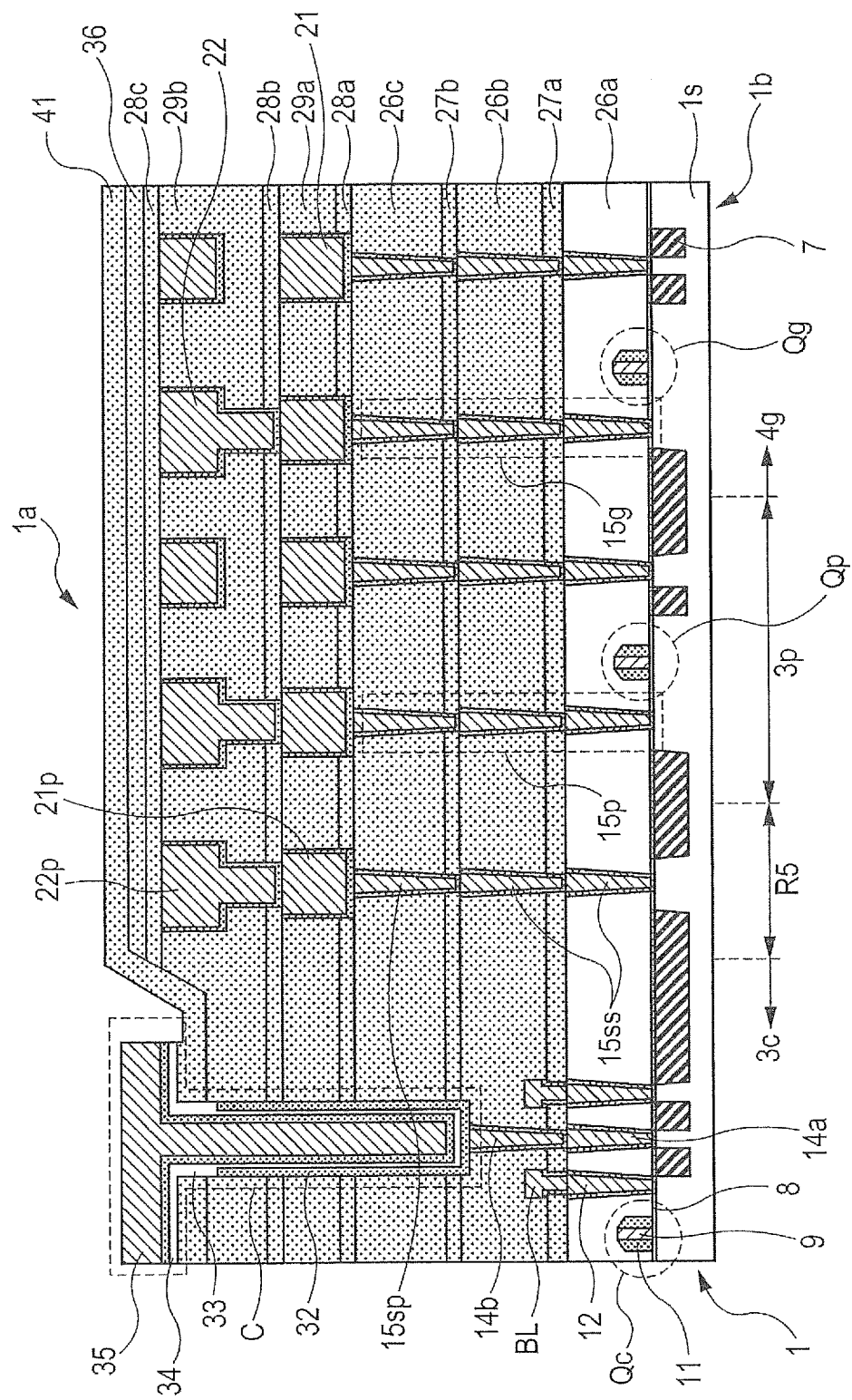
FIG. 19 is a cross-sectional view, corresponding to that in FIG. 4, of the wafer in the middle of the manufacturing process (at the completion of a step of forming a capacitance plate) to describe the exemplary manufacturing process of the semiconductor integrated circuit device according to the embodiment of the present application.
Figure 20:
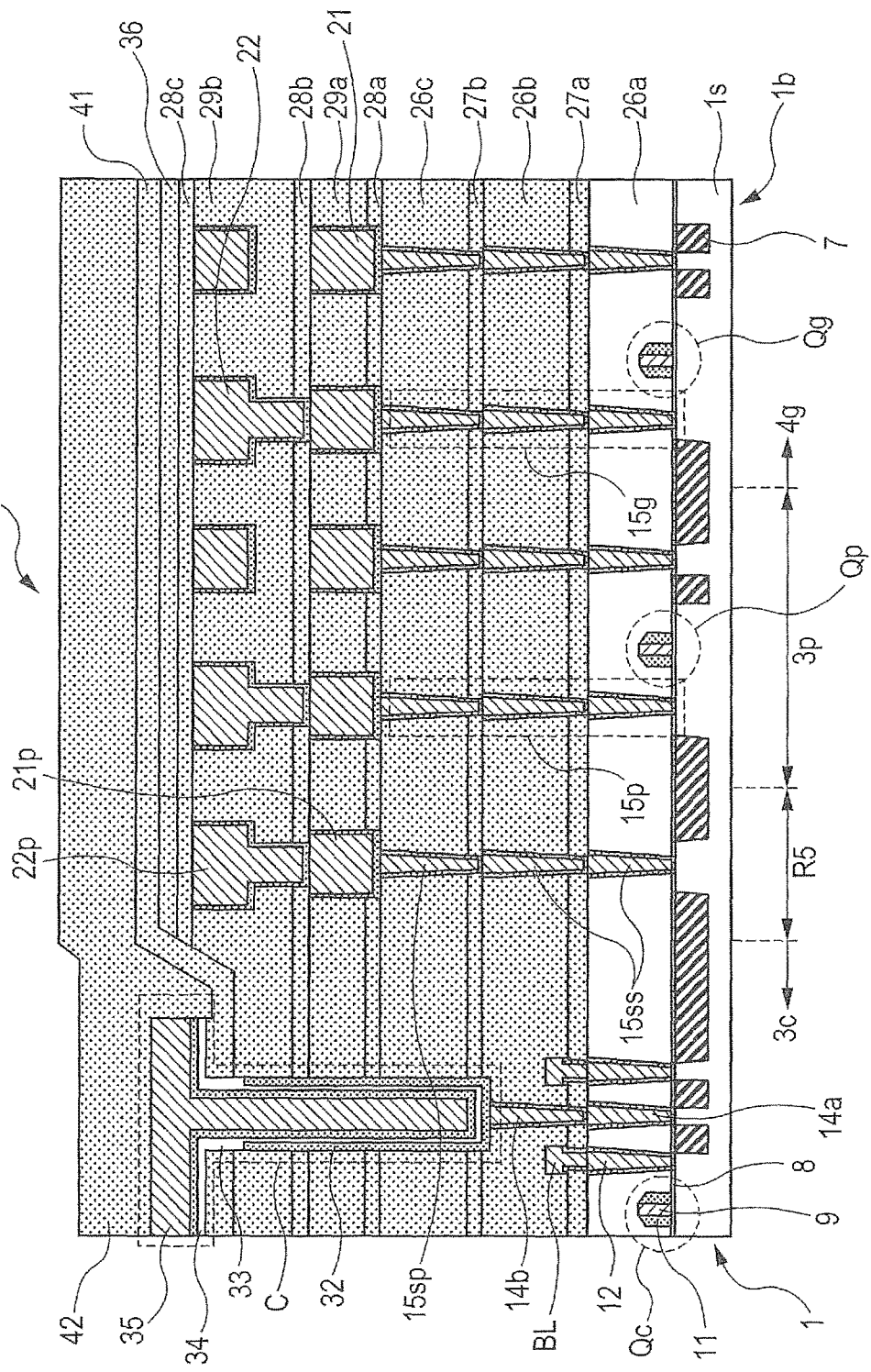
FIG. 20 is a cross-sectional view, corresponding to that in FIG. 4, of the wafer in the middle of the manufacturing process (at the completion of a step of forming a silicon oxide film used for planarizing the upper part of a capacitor) to describe the exemplary manufacturing process of the semiconductor integrated circuit device according to the embodiment of the present application.
Figure 21:
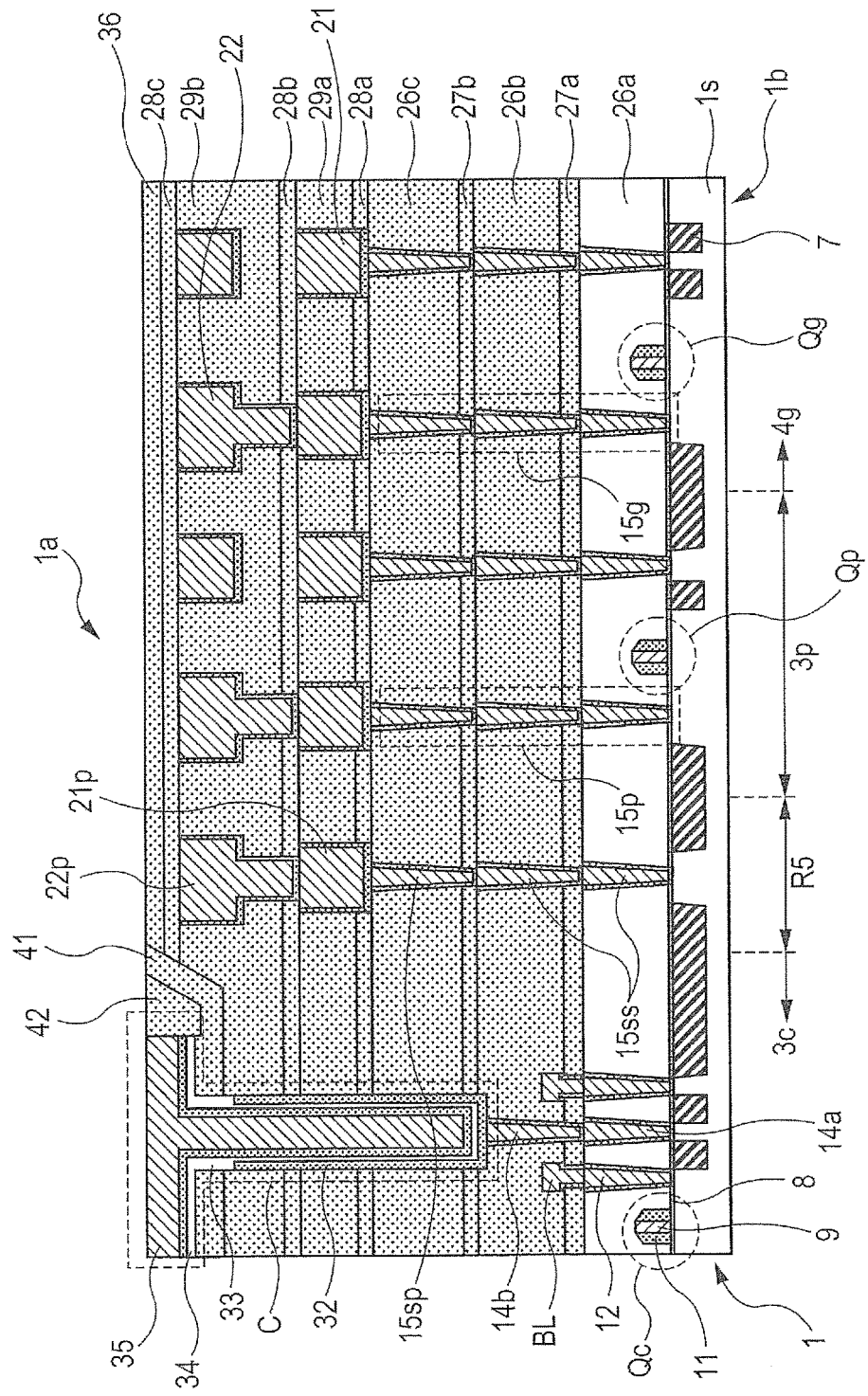
FIG. 21 is a cross-sectional view, corresponding to that in FIG. 4, of the wafer in the middle of the manufacturing process (at the completion of a step of planarizing the upper part of the capacitor) to describe the exemplary manufacturing process of the semiconductor integrated circuit device according to the embodiment of the present application.
Figure 22:
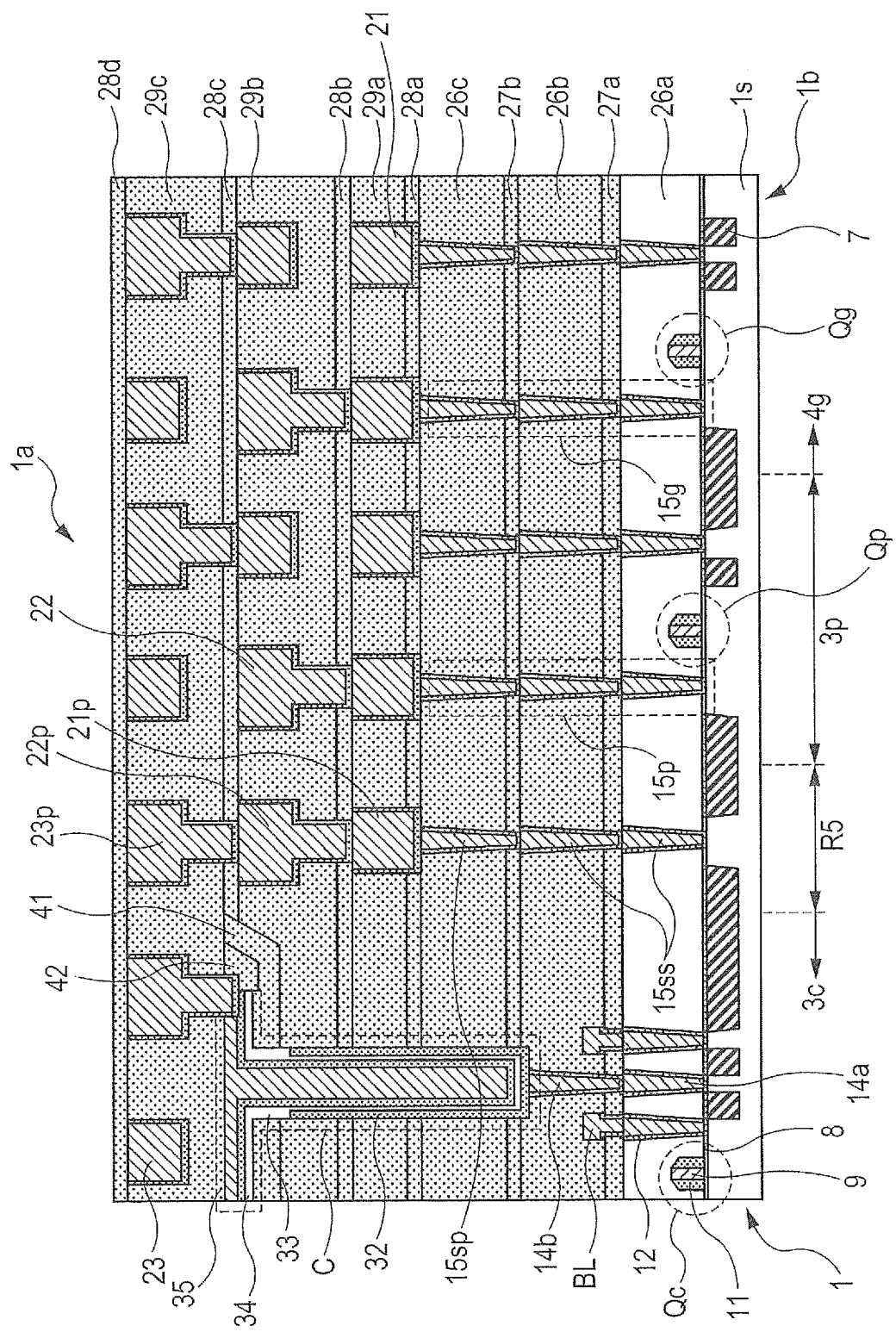
FIG. 22 is a cross-sectional view, corresponding to that in FIG. 4, of the wafer in the middle of the manufacturing process (at the completion of a step of forming an insulative diffusion barrier film 28d of a fourth embedded metal interconnection layer M4) to describe the exemplary manufacturing process of the semiconductor integrated circuit device according to the embodiment of the present application.

FIG. 11 is a cross-sectional view, corresponding to that in FIG. 4, of the wafer in the middle of the manufacturing process (at the completion of the step of forming the insulative diffusion barrier film 28c of the third embedded metal interconnection layer M3) to describe the exemplary manufacturing process of the semiconductor integrated circuit device according to the embodiment of the present application. FIG. 12 is a cross-sectional view, corresponding to that in FIG. 4, of the wafer in the middle of the manufacturing process (at the completion of a step of patterning a resist film 37 for forming a recess to accommodate a plate) to describe the exemplary manufacturing process of the semiconductor integrated circuit device according to the embodiment of the present application. FIG. 13 is a cross-sectional view, corresponding to that in FIG. 4, of the wafer in the middle of the manufacturing process (at the completion of a step of forming a plate accommodation recess 38) to describe the exemplary manufacturing process of the semiconductor integrated circuit device according to the embodiment of the present application. FIG. 14 is a cross-sectional view, corresponding to that in FIG. 4, of the wafer in the middle of the manufacturing process (at the completion of a step of forming a base protective film 41) to describe the exemplary manufacturing process of the semiconductor integrated circuit device according to the embodiment of the present application. FIG. 15 is a cross-sectional view, corresponding to that in FIG. 4, of the wafer in the middle of the manufacturing process (at the completion of a step of forming a capacitor hole 39) to describe the exemplary manufacturing process of the semiconductor integrated circuit device according to the embodiment of the present application. FIG. 16 is a cross-sectional view, corresponding to that in FIG. 4, of the wafer in the middle of the manufacturing process (at the completion of a step of forming a capacitance's lower electrode film) to describe the exemplary manufacturing process of the semiconductor integrated circuit device according to the embodiment of the present application. FIG. 17 is a cross-sectional view, corresponding to that in FIG. 4, of the wafer in the middle of the manufacturing process (at the completion of a step of patterning the film into a capacitance's lower electrode) to describe the exemplary manufacturing process of the semiconductor integrated circuit device according to the embodiment of the present application. FIG. 18 is a cross-sectional view, corresponding to that in FIG. 4, of the wafer in the middle of the manufacturing process (at the completion of a step of forming a capacitance's plate film) to describe the exemplary manufacturing process of the semiconductor integrated circuit device according to the embodiment of the present application. FIG. 19 is a cross-sectional view, corresponding to that in FIG. 4, of the wafer in the middle of the manufacturing process (at the completion of a step of forming a capacitance plate) to describe the exemplary manufacturing process of the semiconductor integrated circuit device according to the embodiment of the present application. FIG. 20 is a cross-sectional view, corresponding to that in FIG. 4, of the wafer in the middle of the manufacturing process (at the completion of a step of forming a silicon oxide film used for planarizing the upper part of a capacitor) to describe the exemplary manufacturing process of the semiconductor integrated circuit device according to the embodiment of the present application. FIG. 21 is a cross-sectional view, corresponding to that in FIG. 4, of the wafer in the middle of the manufacturing process (at the completion of a step of planarizing the upper part of the capacitor) to describe the exemplary manufacturing process of the semiconductor integrated circuit device according to the embodiment of the present application. FIG. 22 is a cross-sectional view, corresponding to that in FIG. 4, of the wafer in the middle of the manufacturing process (at the completion of a step of forming an insulative diffusion barrier film 28d of a fourth embedded metal interconnection layer M4) to describe the exemplary manufacturing process of the semiconductor integrated circuit device according to the embodiment of the present application. Based on these drawings, an exemplary manufacturing process of the semiconductor integrated circuit device according to the embodiment of the present application will be described.

Firstly, referring to FIG. 10, a brief description will be made about steps to achieve the structure shown in FIG. 10. As shown in FIG. 10, for example, a P-type monocrystalline silicon wafer 1 (wafer diameter is, for example, approximately 300 millimeters, and other types of wafers can be used) is prepared and goes through FEOL steps completely. Then, for example, a non-Low-k silicon oxide-based insulating film 27a is formed over a pre-metal main insulating film 26a by plasma CVD, and bitline contact holes are formed by general lithography. Then, for example, a titanium nitride film and a tungsten film are deposited in succession by CVD (general CVD, MOCVD, ALD, or sputtering film formation including ionized sputtering, the same applies to the following cases), and tungsten-based bitlines BL are patterned by general lithography. Subsequently, for example, a non-Low-k silicon oxide-based insulating film 26b is formed over the non-Low-k silicon oxide-based insulating film 27a and tungsten-based bitlines BL by HDP-CVD. Then, for example, plug embedding holes are formed in the non-Low-k silicon oxide-based insulating film 26b by general lithography, a titanium nitride film and a tungsten film are deposited in succession by CVD, and the metal materials out of the plug embedding holes are removed by CMP. Through these steps, a capacitance contact W plug 14b, cylindrical W plugs 15ss and bypass contact W plugs 15g, 15p are formed. Then, for example, a relatively thin SiON film 27b (thinner than the non-Low-k silicon oxide-based insulating film 26b, for example) and a relatively thick non-Low-k silicon oxide-based insulating film 26c (thicker than the SiON film 27b, for example) are formed over the non-Low-k silicon oxide-based insulating film 26b by plasma CVD. Subsequently, planar W plugs 15sp and bypass contact W plugs 15g, 15p are embedded in the same manner. Then, for example, a relatively thin SiCN film 28a and a relatively thick non-porous SiOC film 29a are formed over the non-Low-k silicon oxide-based insulating film 26c by plasma CVD. Then, for example, interconnect trenches are formed by general lithography, and first-layer embedded metal interconnects 21 including a planar first-layer embedded metal interconnect 21p composed of a tungsten nitride barrier film and a copper interconnection film are formed by a single damascene method. Then, for example, a relatively thin SiCN film 28b and a relatively thick porous SiOC film 29b are formed over the non-porous SiOC film 29a by plasma CVD. Then, for example, interconnect trenches are formed by general lithography, and, for example, second-layer embedded metal interconnects 22 including a planar second-layer embedded metal interconnect 22p composed of a tungsten nitride barrier film and a copper interconnection film are formed by a dual damascene method. After a relatively thin SiCN film 28c is formed over the porous SiOC film 29b by plasma CVD, for example, the wafer in the state shown in FIG. 10 is obtained. Through these steps, low-dielectric constant interlayer insulating films are used in the main interlayer insulating film from the first embedded metal interconnection layer M1 to the third embedded metal interconnection layer M3, while interconnection layers are formed across the hierarchy levels at least from the first embedded metal interconnection layer M1 to the third embedded metal interconnection layer M3 outside the memory array area 3. In addition, a metal seal ring 5 is provided across the embedded metal interconnection layers having at least a low-dielectric constant interlayer insulating film (i.e., in the same hierarchy levels) between the memory array area 3 and the non-memory array area 4 so as to surround the memory array area 3. Prior to steps for forming a memory capacitor C, the interconnection layers and the metal seal ring 5 are provided to the semiconductor substrate.

As shown in FIG. 11, a non-Low-k silicon oxide-based insulating film 36 is formed over the SiCN film 28c, for example, by plasma CVD.

As shown in FIG. 12, a resist film 37 for forming a recess to accommodate a plate is formed over the non-Low-k silicon oxide-based insulating film 36, for example, by general lithography.

As shown in FIG. 13, a plate accommodation recess 38 is formed, for example, by wet etching with a hydrofluoric acid-based etching solution. Subsequently, unnecessary resist film 37 is removed from the entire surface, for example, by ashing.

As shown in FIG. 14, a SiN film 41 is formed over almost the entire surface on the front surface 1a side of the wafer 1, for example, by plasma CVD.

As shown in FIG. 15, a capacitor hole 39 (capacitance cylinder, in this example, oval cylinder) is formed, for example, by anisotropic dry etching.

As shown in FIG. 16, a TiN film 32 is formed over almost the entire surface on the front surface 1a side of the wafer 1, for example, by ALD (Atomic Layer Deposition) or MOCVD (Metal-Organic CVD).

As shown in FIG. 17, for example, application of positive resist to almost the entire surface on the front surface 1a side of the wafer 1, exposure, and development leave a resist film only inside the capacitor hole 39. With the residual resist film inside the capacitor hole 39, the TiN film 32 attached to an upper part of and outside the capacitor hole 39 is removed, for example, by dry etching.

As shown in FIG. 18, a zirconium oxide film 33 is formed over almost the entire surface on the front surface 1a side of the wafer 1, for example, by ALD. Then, a TiN film 34 is formed over almost the entire surface of the zirconium oxide film 33, for example, by ALD or MOCVD. Furthermore, a relatively thick (thicker than the TiN film 34) tungsten film 35 is formed over almost the entire surface of the TiN film 34, for example, by thermal CVD.

As shown in FIG. 19, the zirconium oxide film 33, TiN film 34 and tungsten film 35 are patterned in succession, for example, by general lithography (e.g., anisotropic dry etching, etc.).

As shown in FIG. 20, a non-Low-k silicon oxide film 42 used for planarizing an upper part of the capacitor is formed over almost the entire surface of the front surface 1a side of the wafer 1, for example, by plasma CVD.

As shown in FIG. 21, for example, the front surface 1a side of the wafer 1 is planarized by CMP that removes most of the SiN film 41 and non-Low-k silicon oxide film 42 for planarizing the upper part of the capacitor (the films around the capacitance plate 35 remain). At this stage, the CMP sacrificing film 36 may be lost. For the sake of clarity, this description hereafter will continue with the assumption that the CMP sacrificing film 36 has been lost. Thus, the memory capacitor C, or a memory capacitance C, is completed.

As shown in FIG. 22, a relatively thick (thicker than the SiCN film 28c) porous SiOC film 29c is formed over almost the entire surface on the front surface 1a side of the wafer 1, for example, by plasma CVD. Then, interconnect trenches and vias are formed in the porous SiOC film 29c and SiCN film 28c, for example, by general lithography, and third-layer embedded metal interconnects 23 (including vias) including a planar third-layer embedded metal interconnect 23p (including vias) composed of, for example, a tantalum nitride barrier film and a copper interconnection film are formed in the interconnect trenches and vias by a dual damascene method or other methods. Subsequently, a SiCN film 28d is formed over almost the entire surface of the porous SiOC film 29c on the front surface 1a side of the wafer 1, for example, by plasma CVD.

Subsequently (see FIG. 4), the same procedure is performed to form a fourth embedded metal interconnection layer M4 to an uppermost embedded metal interconnection layer MU, an under-pad interlayer insulating film 18, and embedding a tungsten plug 17 in the upper layer through the same method as that used for the pre-metal region PM. In this example, the main interlayer insulating film in the fourth embedded metal interconnection layer M4 is a non-Low-k silicon oxide-based insulating film. In addition, an aluminum-based metal electrode pad 16, serving as a part of a non-embedded interconnect, is formed over the under-pad interlayer insulating film 18. Then, for example, a non-Low-k silicon oxide-based insulating film 19 is formed over the under-pad interlayer insulating film 18 and aluminum-based metal electrode pad 16, for example, by plasma CVD, and a pad opening is formed in the insulating film 19, for example, by general lithography. After that, the wafer is divided by dicing or other cutting methods to obtain the chip 2 as shown in FIG. 4.

As described above, provision of the memory-periphery metal seal ring 5 across from the upper pre-metal sub-region P3 in the pre-metal region PM to the third embedded metal interconnection layer M3 within the memory-periphery metal seal ring formation area R5 prior to steps of forming the memory capacitor C can reduce damage, caused by etching or other processing to form the memory capacitor C, to propagate adjacent areas. In addition, the memory-periphery metal seal ring 5 can reduce hazardous substances or the like to be transferred through the upper and lower layers. In other words, damage toward the non-memory array area during formation of the memory capacitor C (including secondary damage derived from the initial damage) can be reduced.

3. Description on Modification 1 (Memory-Periphery Metal Seal Ring Vp Coupling Structure) Associated with the Device Structure of the Semiconductor Integrated Circuit Device According to the Embodiment of the Present Application (Mainly FIGS. 23 and 24)

This section presents a modification of the device structure described in Section 1 in terms of the potential relationship of the memory-periphery metal seal ring 5 with the impurity region structure of the semiconductor substrate (mainly corresponding to FIGS. 8 and 9). Since the basic structure of Modification 1 is identical to that described in Section 1, only different parts will be described in principle below (this is applied to Modification 2). The manufacturing method described in Section 2 is applicable to Modification 1 almost as it is, and therefore will not be iterated for Modifications 1, 2 below.

In this application, descriptions will be made on the precondition that a bitline half precharge scheme (Vdd/2 precharge scheme) is used; however, it is needless to say that a ground precharge scheme (Vss precharge scheme) is also applicable.

Figure 23:
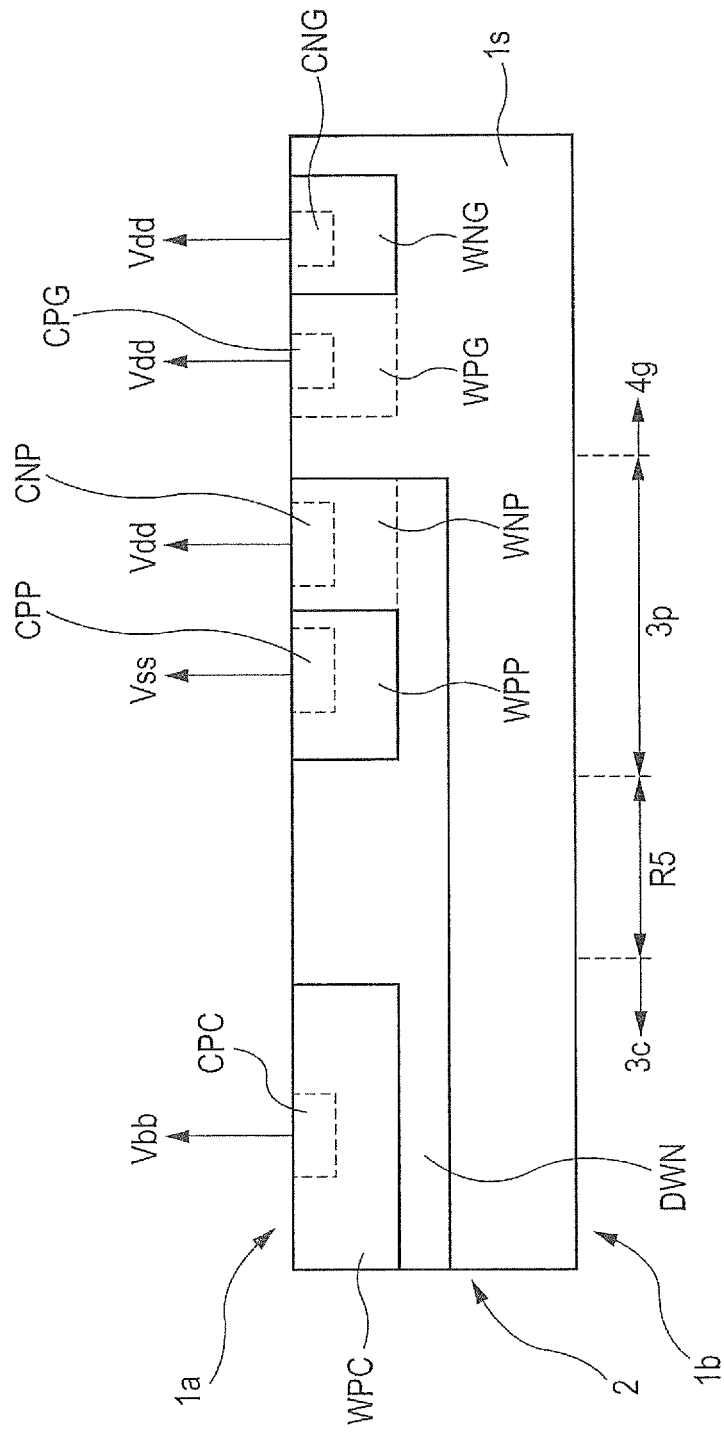
FIG. 23 is a schematic cross-sectional view (corresponding to FIG. 8) of a semiconductor substrate part and so on to describe Modification 1 (memory-periphery metal seal ring Vp coupling structure) associated with the device structure of the semiconductor integrated circuit device according to the embodiment of the present application.
Figure 24:
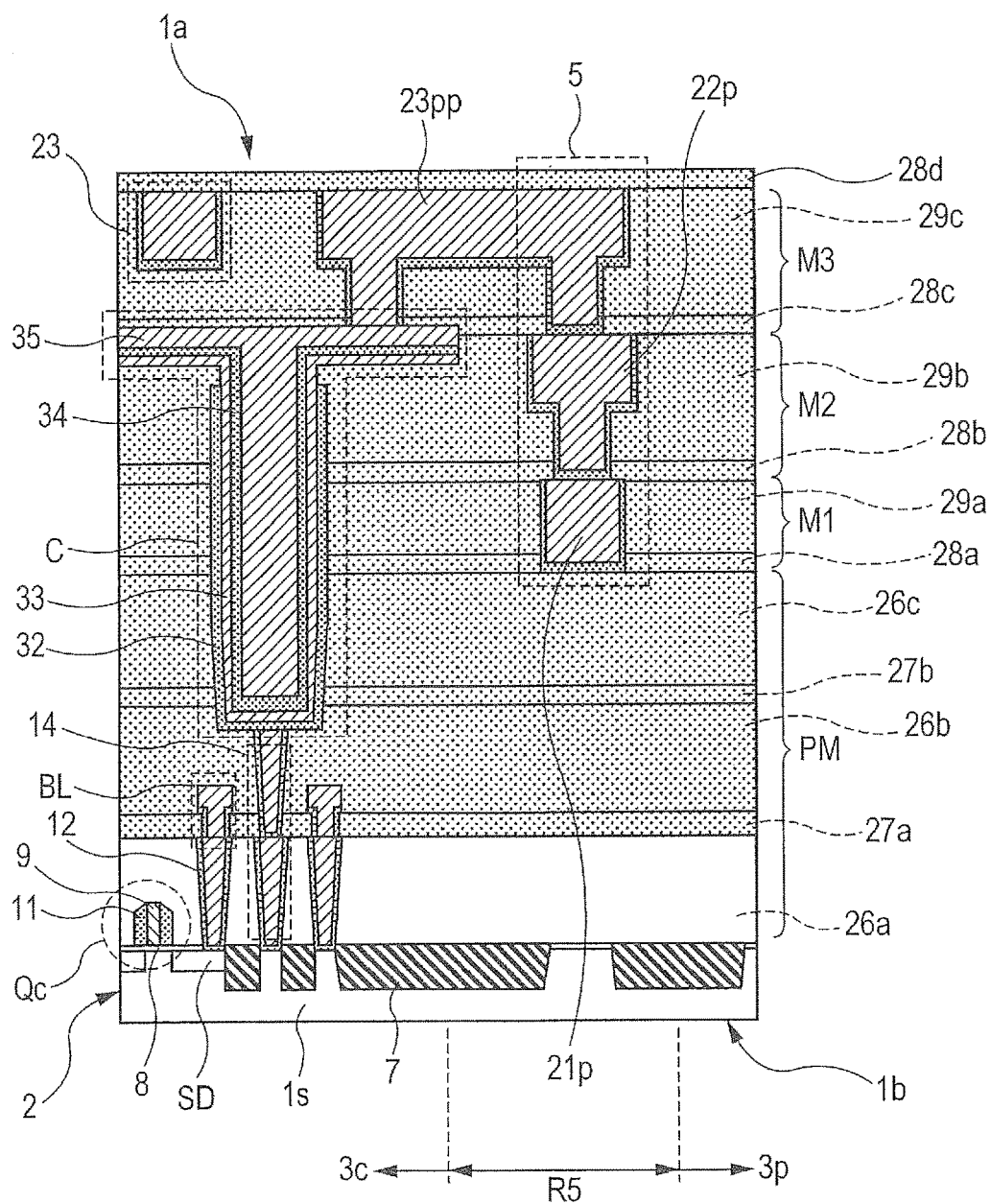
FIG. 24 is a device cross-sectional view (corresponding to FIG. 9) showing the detailed structure of the memory-periphery metal seal ring formation area R5 to describe Modification 1 (memory-periphery metal seal ring Vp coupling structure) associated with the device structure of the semiconductor integrated circuit device according to the embodiment of the present application.

FIG. 23 is a schematic cross-sectional view (corresponding to FIG. 8) of a semiconductor substrate part and so on to describe Modification 1 (memory-periphery metal seal ring Vp coupling structure) associated with the device structure of the semiconductor integrated circuit device according to the embodiment of the present application. FIG. 24 is a device cross-sectional view (corresponding to FIG. 9) showing the detailed structure of the memory-periphery metal seal ring formation area R5 to describe Modification 1 (memory-periphery metal seal ring Vp coupling structure) associated with the device structure of the semiconductor integrated circuit device according to the embodiment of the present application. Based on these drawings, Modification 1 (memory-periphery metal seal ring Vp coupling structure) associated with the device structure of the semiconductor integrated circuit device according to the embodiment of the present application will be described.

Unlike FIG. 8, a distinctive feature of this example shown in FIG. 23 is in that the memory-periphery metal seal ring 5 is not coupled to the same potential as the memory-array P-type well region WPC. In other words, the memory-periphery metal seal ring 5 is electrically separated from the memory-array P-type well region WPC.

Specifically, unlike FIG. 9, the memory-periphery metal seal ring 5 shown in FIG. 24 is coupled to the capacitance plate 35 via, for example, a planar third-layer embedded metal interconnect 23pp (including vias) intended for use in coupling to the plate, the interconnect 23pp being a part of a third-layer embedded metal interconnect 23 (including vias). In other words, since this example employs the half precharge scheme, the potential of the memory-periphery metal seal ring 5 is held at a plate potential Vp (Vdd/2 potential), or a half of supply potential Vdd (midpoint value).

Coupling the memory-periphery metal seal ring 5 to the plate voltage Vp (Vdd/2 potential) provides merits, for example, it can sufficiently narrow the distance between the memory-periphery metal seal ring 5 and the capacitance plate 35.

When a ground precharge scheme is employed, the potential of the memory-periphery metal seal ring 5 apparently becomes equal to a ground potential Vss. In the case of the ground precharge scheme, coupling the memory-periphery metal seal ring 5 to the plate voltage Vp (ground potential Vss) can sufficiently narrow the distance between the memory-periphery metal seal ring 5 and the capacitance plate 35 and also provide the same effect as the case where the memory-periphery metal seal ring 5 is coupled to any of potentials of the substrate.

In consideration of a relatively high potential to be applied to the memory capacitance portion, equalizing the potential of the memory-periphery metal seal ring 5 with the plate potential Vp is also effective to prevent TDDB (Time-Dependent Dielectric Breakdown). Since the memory portion generally operates with a high voltage in comparison with the logic circuit, if the memory-periphery metal seal ring 5 and the capacitance plate 35 have different potentials, the memory-periphery metal seal ring 5, which occupies a relatively large area, needs to be separated from the capacitance plate 35 with a wide space therebetween.

4. Description on Modification 2 (Memory-Periphery Metal Seal Ring Vss Coupling Structure) Associated with the Device Structure of the Semiconductor Integrated Circuit Device According to the Embodiment of the Present Application (Mainly FIGS. 25 and 26)

This section mainly presents an example in which the memory-periphery metal seal ring 5 is grounded to a memory-periphery P-type well region WPP, which is independent of a memory-array P-type well region WPC, and the memory-array P-type well region WPC and memory-periphery P-type well region WPP are formed in the same deep N-type well region DWN. However, the example, which will be described below, is not limited to those. The memory-periphery P-type well region WPP may be formed in a different deep N-type well region from the deep N-type well region DWN with the memory-array P-type well region WPC formed. Alternatively, the memory-periphery metal seal ring 5 may be directly grounded to a P-type substrate or the like (for example, via an impurity region corresponding to the sealed-ring P-type well contact region CPS).

Figure 25:
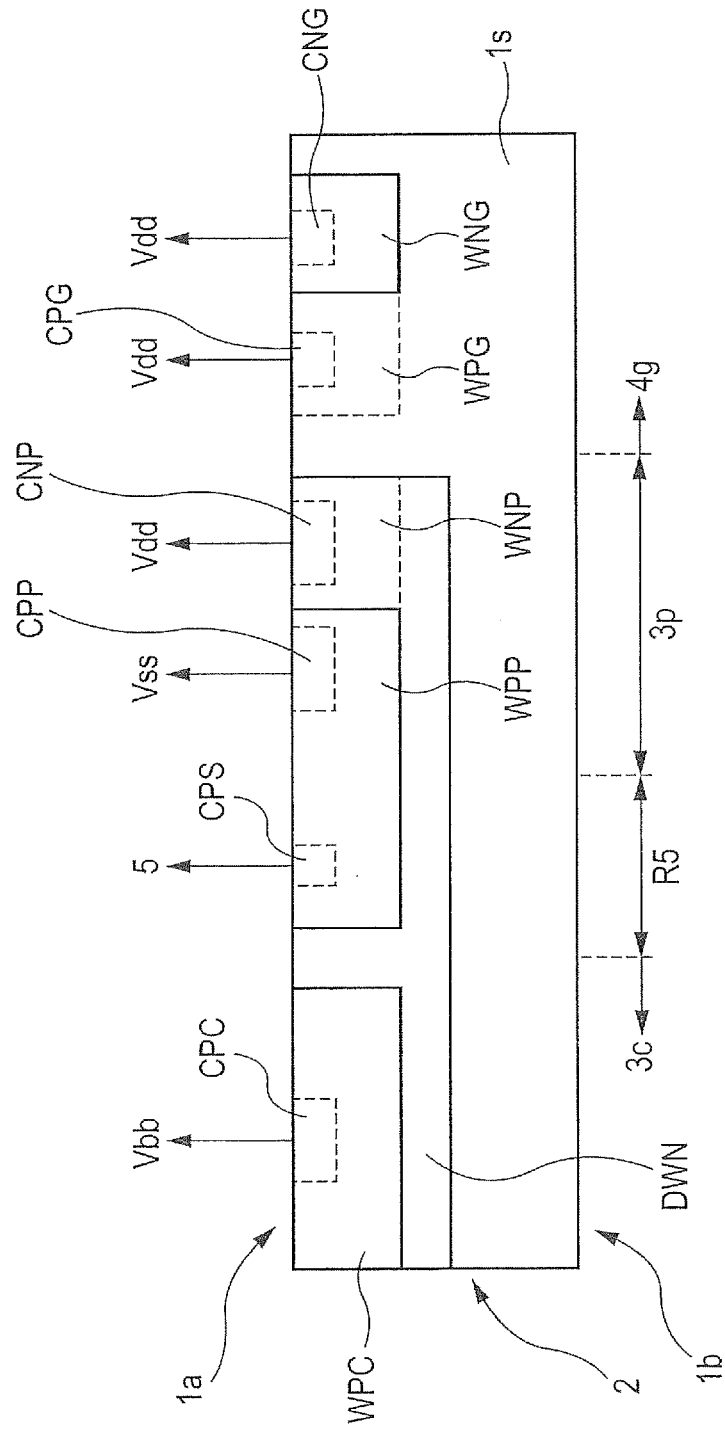
FIG. 25 is a schematic cross-sectional view (corresponding to FIG. 8) of a semiconductor substrate part and so on to describe Modification 2 (memory-periphery metal seal ring Vss coupling structure) associated with the device structure of the semiconductor integrated circuit device according to the embodiment of the present application.
Figure 26:
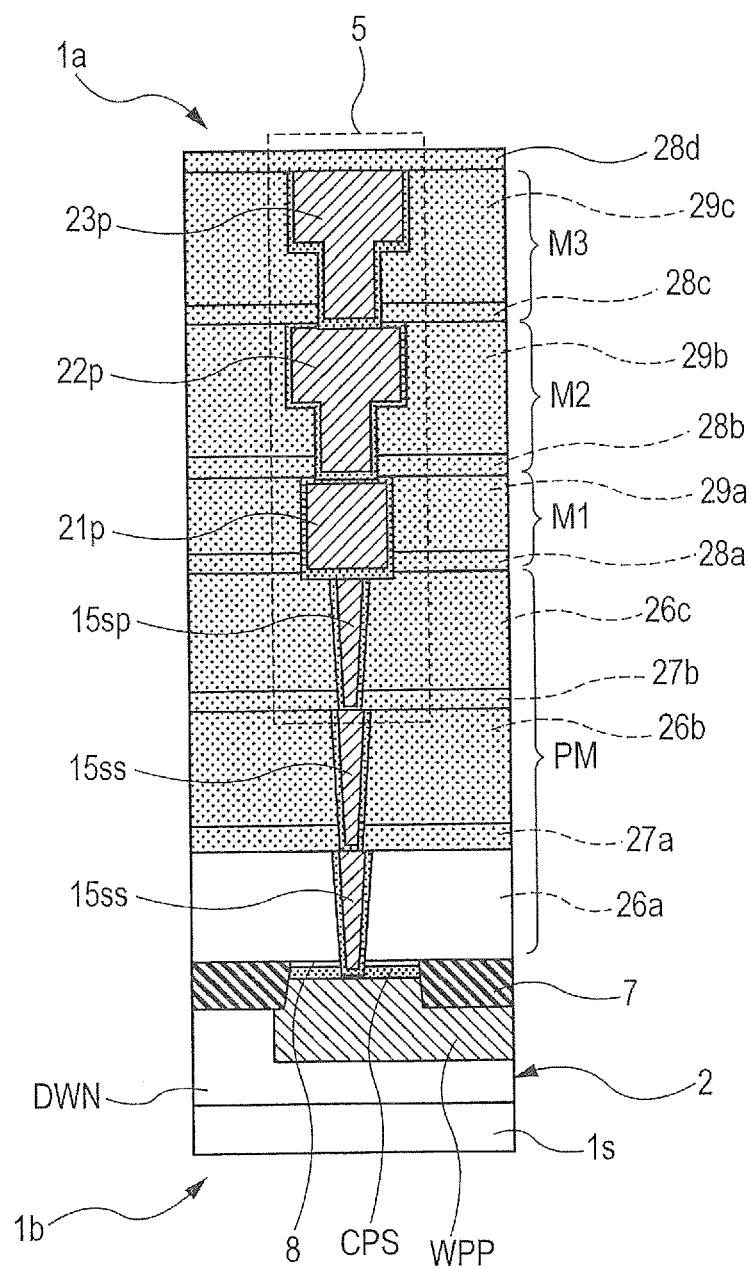
FIG. 26 is a device cross-sectional view (corresponding to FIG. 9) showing the detailed structure of the memory-periphery metal seal ring formation area R5 to describe Modification 2 (memory-periphery metal seal ring Vss coupling structure) associated with the device structure of the semiconductor integrated circuit device according to the embodiment of the present application.

FIG. 25 is a schematic cross-sectional view (corresponding to FIG. 8) of a semiconductor substrate part and so on to describe Modification 2 (memory-periphery metal seal ring Vss coupling structure) associated with the device structure of the semiconductor integrated circuit device according to the embodiment of the present application. FIG. 26 is a device cross-sectional view (corresponding to FIG. 9) showing the detailed structure of the memory-periphery metal seal ring formation area R5 to describe Modification 2 (memory-periphery metal seal ring Vss coupling structure) associated with the device structure of the semiconductor integrated circuit device according to the embodiment of the present application. Based on the drawings, Modification 2 (memory-periphery metal seal ring Vss coupling structure) associated with the device structure of the semiconductor integrated circuit device according to the embodiment of the application will be described.

As shown in FIG. 25, this example is different from that shown in FIG. 8 in that the memory-periphery metal seal ring 5 is coupled to a ground potential Vss via a sealed-ring P-type well contact region CPS provided on the surface of the memory-periphery P-type well region WPP, for example. In other words, the memory-periphery metal seal ring 5 is electrically separated from the memory-array P-type well region WPC as with the case in Section 3.

Specifically, as shown in FIG. 26, the memory-periphery metal seal ring 5 is in contact with the sealed-ring P-type well contact region CPS over the front surface 1a of the semiconductor substrate 1s via a cylindrical W plug 15ss.

Coupling the memory-periphery metal seal ring 5 to any of ground potentials Vss of the substrate provides merits, especially, stabilization of the potential, reduction of noise propagation, and so on. In addition, coupling the memory-periphery metal seal ring 5 to the potential of the memory-periphery P-type well region WPP that is electrically isolated from the well region in the non-memory area 4g in which a logic circuit with high noise is placed is especially effective to cut off the noise from the logic circuit.

In addition, the memory-periphery metal seal ring 5 coupled to any of the ground potentials Vss of the substrate can be also used as a ground conductor.

With consideration given to constant application of plate potential Vp (Vdd/2 potential) to the capacitance plate 35, however, it is more effective to couple the memory-periphery metal seal ring 5 to the supply potential Vdd in the case where the supply potential value Vdd is relatively close to the plate potential value Vp and the relationship |Vdd−Vp|<|Vp| is established. The advantage of this coupling structure is that the memory-periphery metal seal ring 5 can be used as a supply conductor.

5. Supplementary Explanation on the Embodiment (Including the Modifications) and General Consideration (Mainly FIG. 27)

Figure 27:
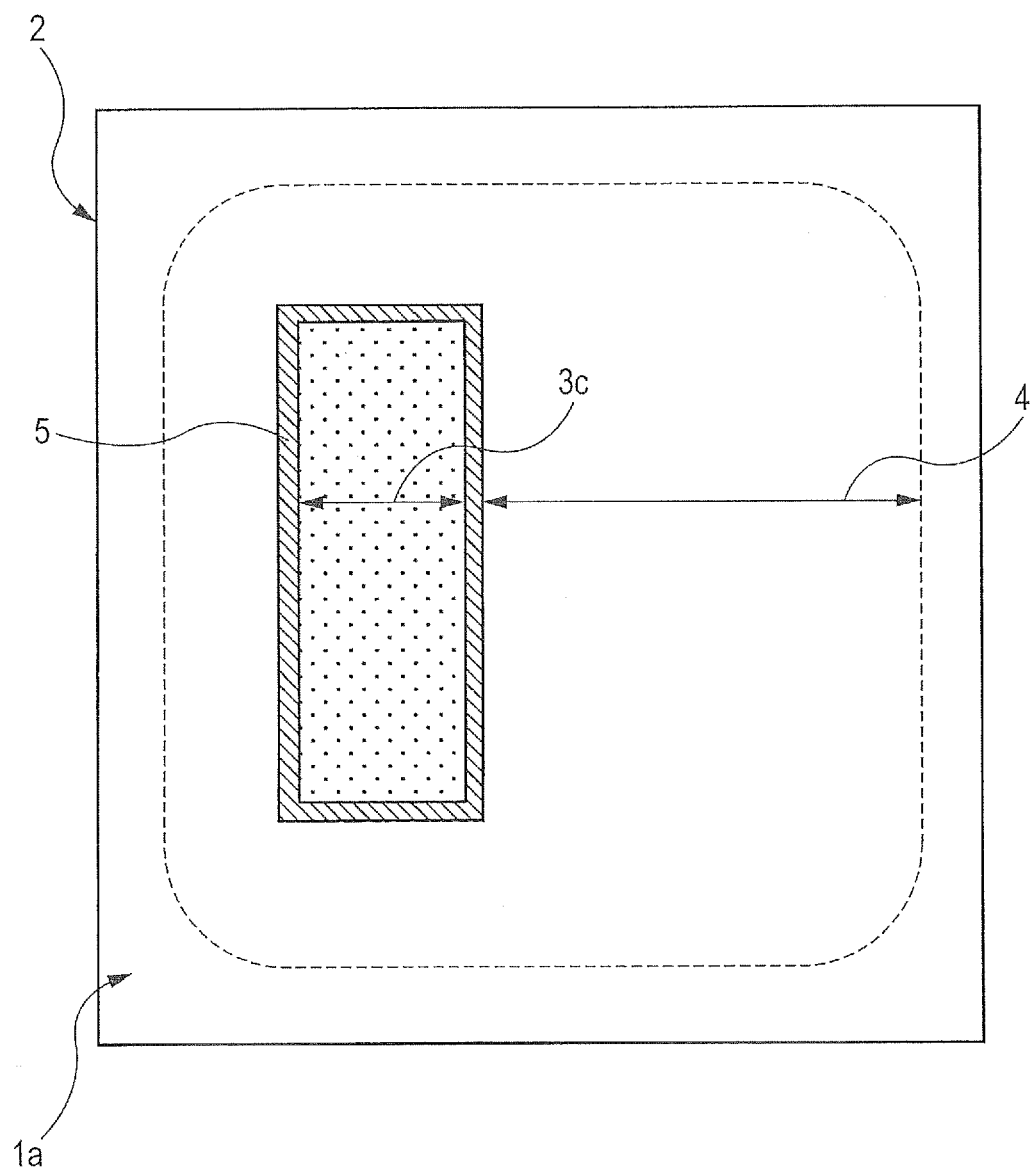
FIG. 27 is a schematic top view of a chip to describe the outline of the semiconductor integrated circuit device according to the embodiment of the present application.

FIG. 27 is a schematic top view of a chip to describe the outline of the semiconductor integrated circuit device according to the embodiment of the present application. Based on FIG. 27, a supplementary explanation on the previously-described embodiment (including the modifications) and general consideration will be given.

(1) Description of an Outline of the Embodiment (Including the Modifications) (Mainly FIG. 27):

The embodiment (including the modifications) of the present application is mainly directed to a device (semiconductor chip 2) that includes interconnection layers with Low-k insulating films and a DRAM memory array area 3c. A measure is taken to the device so that hazardous process material components do not adversely affect the non-memory array area 4 through the relatively not-dense (compared with a non-Low-k insulating film) Low-k insulating film during formation of the memory capacitance. Specifically, as shown in FIG. 27, a feature of the present invention is that the memory-periphery metal seal ring 5, which has a similar structure to the chip-periphery metal seal ring 6, is disposed in the interconnection layers with the Low-k insulating films that cause the above-mentioned problem so as to surround the memory array area 3c in a plane.

(2) Supplementary Explanation on Interconnection-layer Intrusion-type Memory Capacitor, Memory-periphery Metal Seal Ring, etc.:

In the initial COB structure, the memory capacitor C is enclosed in the stacked layers within the pre-metal region PM and therefore the interference effect of the capacitor forming process and the Low-k interlayer insulating film have not been a problem. However, if the interconnection-layer intrusion-type memory capacitor is employed, the memory capacitor C is present across from the pre-metal region PM to the metal interconnect region (especially, from a lower layer to an intermediate layer). Since the lower to the intermediate interconnection layers (hierarchy level) are especially often made of Low-k interlayer insulating films, measures are indispensable to prevent the interference effect of the capacitor forming process and Low-k interlayer insulating films. It is conceivable that the intrusion of the memory capacitor C into the hierarchy levels of the upper-layer interconnects, which include a power supply trunk, a ground trunk, a global signal interconnect, is relatively rare. If multilayer embedded interconnection composed of about nine layers is taken as an example, the upper end of the hierarchy levels into which the memory capacitor C intrudes is assumed to be generally from the second-layer embedded metal interconnect M2 to the Nth embedded metal interconnection layer (N=6) at highest. In the case of the nine-layer embedded interconnection, generally, the interlayer insulating films of the upper interconnection layers, or, for example, the seventh embedded metal interconnection layer to the ninth embedded metal interconnection layer, are often made of non-Low-k films. Even if the memory capacitance intrudes into those layers, there may be less merit to extend the memory-periphery metal seal ring 5 up to those hierarchy levels. Of course, there is no problem to extend the memory-periphery metal seal ring 5 to the hierarchy levels.

Although FIG. 5 and some other drawings show an example in which the cylindrical W plugs 15ss are used in the intermediate pre-metal sub-region P2 and lower pre-metal sub-region P1, it is needless to say that the cylindrical W plugs 15ss can be replaced with planar W plugs 15sp with openings therebetween. In addition, the examples shown in FIGS. 4 to 7, FIG. 9, FIGS. 24 and 26 illustrate the memory-periphery metal seal ring 5 having the upper end at the hierarchy level to which the third embedded metal interconnection layer M3 belongs; however, it is needless to say that the memory-periphery metal seal ring 5 can be further extended to an upper hierarchy level in which a Low-k interlayer insulating film is not used.

6. Summary

In the foregoing, the invention made by the inventors has been described in detail based on the embodiment; however, it is needless to say that the present invention is not limited to the foregoing embodiment and various modifications and alterations can be made within the scope of the present invention.

For example, the embodiment has been described in detail mainly with embedded metal interconnects as an example; however, the present invention is not limited thereto, and it is needless to say that the invention is applicable to a chip using non-embedded metal interconnects, such as aluminum-based metal interconnects.

In addition, the embodiment has been described in detail mainly to fabricate a device over a P-type monocrystalline silicon substrate as an example; however, the present invention is not limited thereto, and it is needless to say that the device can be fabricated over various semiconductor layers over an N-type or P-type monocrystalline silicon substrate, various epitaxial substrates of N-type or P-type, an insulation substrate (including an SOI substrate, etc.) and other types of semiconductor substrates.

Furthermore, the memory is not limited to the DRAM memory, but can be a phase change memory or a resistance change memory.

What is claimed is:

1. A method for manufacturing a semiconductor integrated circuit device, the method comprising:
    preparing a semiconductor substrate including a first main surface and a second main surface, the semiconductor substrate further including:
        a memory array area and a non-memory array area provided over the first main surface;
        a first embedded metal interconnection layer to an Nth embedded metal interconnection layer provided over the first main surface, each of the first embedded metal interconnection layer to the Nth embedded metal interconnection layer being stacked together on top of one another; and
        a low-dielectric, constant interlayer insulating film provided to at least one of the first to Nth embedded metal interconnection layers;
    forming a memory-periphery metal seal ring provided between the memory array area and the non-memory array area so as to surround the memory array area; and
    after the forming of the memory-periphery metal seal ring, forming a plurality of memory capacitors across and embedded in at least from the first to Nth embedded metal interconnection layers stacked together on top of one another in the memory array area surrounded by the memory-periphery metal seal ring, the memory capacitors each comprising a metal insulator metal structure,
    wherein the memory-periphery metal seal ring separates the memory array area from the non-memory array area, wherein the low-dielectric constant interlayer insulating film comprises a porous low-dielectric constant film SiOC, and wherein each of the first embedded metal interconnection layer to the Nth embedded metal interconnection layer being directly stacked together in a single stack and directly connected on top of one another including the low-dielectric constant interlayer insulating film.

2. The method for manufacturing a semiconductor integrated circuit device according to claim 1, wherein, the forming of the memory-periphery metal seal ring further comprises the memory-periphery metal seal ring formed so as to extend across the embedded metal interconnection layers that are stacked on top of one another including the low-dielectric constant interlayer insulating film, wherein the plurality of memory capacitors are surrounded by the memory-periphery metal seal ring, wherein the plurality of memory capacitors are formed across at least from the first to Nth embedded metal interconnection layers that are stacked, where N is an integer of at least three, and wherein the memory capacitors each comprising the metal insulator metal structure that includes:
an individually separated capacitance's lower electrode disposed at a lowest part of the metal insulator metal structure;
a capacitance insulating film formed over the capacitance's lower electrode;
a capacitance's upper electrode formed over the capacitance insulating film so as to integrally cover a plurality of cells; and
a capacitance plate integrally covering the capacitance's upper electrode.

3. The method for manufacturing a semiconductor integrated circuit device according to claim 1, wherein the memory-periphery metal seal ring is formed so as to be embedded in the embedded metal interconnection layers including the low-dielectric constant interlayer insulating film, and wherein the memory-periphery metal seal ring is formed in only layers in hierarchy levels of multi-layered interconnects including pre-metal regions, further comprising forming a chip-periphery metal seal ring at an outermost edge of a front surface of a semiconductor chip, the chip-periphery metal seal ring surrounding the memory-periphery metal seal ring, memory array area and non-memory array area.

4. The method for manufacturing a semiconductor integrated circuit device according to claim 1, further comprising the following sequential steps of after the forming of the memory-periphery metal seal ring and before the forming of the plurality of memory capacitors:

forming an etching protective layer over the memory array area and an area including the memory-periphery metal seal ring;

forming a plurality of openings of the etching protective layer in the memory array area; and performing an etching to a part of the embedded metal interconnection layers in the memory array area through the openings so as to form a plurality of holes in the embedded metal interconnection layers to embed the memory capacitors.

5. The method for manufacturing a semiconductor integrated circuit device according to claim 4, wherein, the performing of the etching to the part of the embedded metal interconnection layers in the memory array area, further comprises the etching to the embedded metal interconnection layers in the memory array area is performed while the etching protective layer covers an area directly over the memory-periphery metal seal ring.

6. The method for manufacturing a semiconductor integrated circuit device according to claim 1, further comprising the following before the forming of the plurality of memory capacitors:

forming an etching protective layer over the memory array area and an area including the memory-periphery metal seal ring;

forming a plurality of openings of the etching protective layer in the memory array area; and performing an etching to a part of the embedded metal interconnection layers in the memory array area through the openings so as to form a plurality of holes in the embedded metal interconnection layers to embed the memory capacitors, wherein, the performing of the etching to the part of the embedded metal interconnection layers in the memory array area, further comprises the etching to the embedded metal interconnection layers in the memory array area is performed while the etching protective layer covers an area directly over the memory-periphery metal seal ring.

7. The method for manufacturing a semiconductor integrated circuit device according to claim 1, wherein the memory array area has a COB (Capacitor Over Bitline) structure, and wherein N is an integer greater of at least four for the Nth embedded metal interconnection layer, and wherein a body of each of the plurality of memory capacitors having a capacitive property for memory are formed across and embedded from the first to Nth embedded metal interconnection layers stacked and connected together on top of one another in a single stack along a line in the memory array area surrounded by the memory-periphery metal seal ring.

8. The method for manufacturing a semiconductor integrated circuit device according to claim 1, wherein the forming of the plurality of memory capacitors include forming an upper electrode interconnecting the memory capacitors and lower electrodes provided to respective memory capacitors, and wherein the plurality of memory capacitors are formed across and embedded the first to Nth embedded metal interconnection layers stacked together on top of one another in the memory array area surrounded by the memory-periphery metal seal ring.

9. The method for manufacturing a semiconductor integrated circuit device according to claim 1, wherein the forming of the memory-periphery metal seal ring further comprises electrically separating from the P-type well region in the memory array area at the semiconductor substrate, and the memory-periphery metal seal ring is formed in limited layers in a hierarchy levels of multi-layered interconnects from the first to Nth embedded metal interconnection layers.

10. The method for manufacturing a semiconductor integrated circuit device according to claim 1, wherein the non-memory array area includes a logic circuit area, and the method further comprising:

forming a memory periphery area surrounding the memory-periphery metal seal ring, the memory periphery area includes memory peripheral circuits, wherein the non-memory array area surrounds the memory periphery area; and forming a second seal ring surrounding the non-memory array area, wherein the seal ring is provided across from an upper pre-metal sub-region in the pre-metal region to a third embedded metal interconnection layer from among the first to Nth embedded metal interconnection layers.

11. A method for a semiconductor integrated circuit device, the method comprising;

preparing a semiconductor substrate including a first main surface and a second main surface, the preparing of the semiconductor substrate further including:

forming a memory array area and a non-memory array area over the first main surface;

forming a first embedded metal interconnection layer to an Nth embedded metal interconnection layer provided over the first main surface, each of the first embedded metal interconnection layer to the Nth embedded metal interconnection layer being stacked together on top of one another; and forming a low-dielectric constant interlayer insulating film to at least one of the first to Nth embedded metal interconnection layers;

forming a memory-periphery metal seal ring provided between the memory array area and the non-memory array area around the memory array area before forming a plurality of memory capacitors in the memory array area surrounded by the memory-periphery metal seal ring, wherein the memory-periphery metal seal ring separates the memory array area from the non-memory array area; and after the forming of the memory-periphery metal seal ring, forming the plurality of memory capacitors across and embedded in at least from the first to Nth embedded metal interconnection layers stacked together on top of one another in the memory array area subsequent to the preparing of the semiconductor substrate, each of the memory capacitors formed with a metal insulator metal structure, wherein the low-dielectric constant interlayer insulating film comprises a porous low-dielectric constant film including SiOC, and wherein each of the first embedded metal interconnection layer to the Nth embedded metal interconnection layer being directly stacked together in a single stack and directly connected on top of one another including the low-dielectric constant interlayer insulating film.

12. The method according to claim 11, wherein, the forming of the memory-periphery metal seal ring further comprises the memory-periphery metal seal ring formed so as to extend across the embedded metal interconnection layers including the low-dielectric constant interlayer insulating film.

13. The method according to claim 11, wherein the memory-periphery metal seal ring is formed so as to be embedded in the embedded metal interconnection layers including the low-dielectric constant interlayer insulating film.

14. The method according to claim 11, further comprising the following sequential steps of after the forming of the memory-periphery metal seal ring and before the forming of the plurality of memory capacitors:

forming an etching protective layer over the memory array area and an area including the memory-periphery metal seal ring;

forming a plurality of openings of the etching protective layer in the memory array area; and performing an etching to a part of the embedded metal interconnection layers in the memory array area through the openings so as to form a plurality of holes in the embedded metal interconnection layers to embed the memory capacitors.

15. The method according to claim 14, wherein, the performing of the etching to the part of the embedded metal interconnection layers in the memory array area, further comprises the etching to the embedded metal interconnection layers in the memory array area is performed while the etching protective layer covers an area directly over the memory-periphery metal seal ring.

16. The method according to claim 11, further comprising the following before the forming of the plurality of memory capacitors:

forming an etching protective layer over the memory array area and an area including the memory-periphery metal seal ring;

forming a plurality of openings of the etching protective layer in the memory array area; and performing an etching to a part of the embedded metal interconnection layers in the memory array area through the openings so as to form a plurality of holes in the embedded metal interconnection layers to embed the memory capacitors.

17. The method according to claim 11, wherein the forming of the plurality of memory capacitors include forming an upper electrode interconnecting the memory capacitors and lower electrodes provided to respective memory capacitors.

18. The method according to claim 11, wherein the forming of the memory-periphery metal seal ring further comprises electrically separating from the P-type well region in the memory array area at the semiconductor substrate, and wherein the non-memory array area includes a logic circuit area.

19. The method according to claim 11, further comprising forming a memory periphery area surrounding the memory-periphery metal seal ring, the memory periphery area includes memory peripheral circuits, wherein the non-memory array area surrounds the memory periphery area; and forming a second seal ring surrounding the non-memory array area.

* * * * *